(12) United States Patent
Najafi

(10) Patent No.: US 12,095,462 B2
(45) Date of Patent: Sep. 17, 2024

(54) SUPERCONDUCTING LOGIC CIRCUITS

(71) Applicant: PsiQuantum Corp., Palo Alto, CA (US)

(72) Inventor: Faraz Najafi, San Francisco, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 0 days.

(21) Appl. No.: 18/127,530

(22) Filed: Mar. 28, 2023

(65) Prior Publication Data

US 2023/0253967 A1    Aug. 10, 2023

Related U.S. Application Data

(63) Continuation of application No. 17/486,615, filed on Sep. 27, 2021, now Pat. No. 11,621,714, which is a
(Continued)

(51) Int. Cl.
| | | |
|---|---|---|
| *H03K 19/195* | (2006.01) | |
| *H01L 23/552* | (2006.01) | |
| *H01L 31/02* | (2006.01) | |
| *H03K 19/20* | (2006.01) | |
| *H03K 19/23* | (2006.01) | |

(Continued)

(52) U.S. Cl.
CPC ......... *H03K 19/195* (2013.01); *H01L 23/552* (2013.01); *H01L 31/02027* (2013.01); *H03K 19/1954* (2013.01); *H03K 19/1958* (2013.01); *H03K 19/20* (2013.01); *H03K 19/23* (2013.01);
(Continued)

(58) Field of Classification Search
None
See application file for complete search history.

(56) References Cited

U.S. PATENT DOCUMENTS 3,059,196 A    10/1962 Lentz
3,119,076 A    1/1964 Schlig et al.
(Continued)

FOREIGN PATENT DOCUMENTS

CN    106289515 A    1/2017
CN    106549099 A    3/2017
(Continued)

OTHER PUBLICATIONS

Akhlaghi et al., "Gated Mode 145:149 Superconducting Nanowire Single Photon Detectors," Optics Express, vol. 20, No. 2, Jan. 16, 2012, 9 pgs.
(Continued)

*Primary Examiner* — Anh Q Tran
(74) *Attorney, Agent, or Firm* — Morgan, Lewis & Bockius LLP

(57) ABSTRACT

An electric circuit includes one or more photon detector components and a superconducting logic gate component coupled to respective outputs of the one or more photon detector components. The electric circuit further includes a bias source electrically coupled to the superconducting logic gate component, the bias source configured to provide a bias current adapted to cause the superconducting logic gate component to function as a logical gate. The electric circuit also includes an optical switch component electrically coupled to an output of the superconducting logic gate component.

16 Claims, 29 Drawing Sheets

Related U.S. Application Data continuation of application No. 16/840,166, filed on Apr. 3, 2020, now Pat. No. 11,133,805, which is a continuation of application No. PCT/US2018/054414, filed on Oct. 4, 2018, which is a continuation of application No. 16/151,180, filed on Oct. 3, 2018, now Pat. No. 10,361,703, and a continuation of application No. 16/151,190, filed on Oct. 3, 2018, now Pat. No. 10,374,611.

(60) Provisional application No. 62/630,657, filed on Feb. 14, 2018, provisional application No. 62/585,519, filed on Nov. 13, 2017, provisional application No. 62/568,677, filed on Oct. 5, 2017.

(51) Int. Cl.
*H10N 60/12* (2023.01)
*H10N 60/30* (2023.01)
*H10N 60/35* (2023.01)
*H10N 69/00* (2023.01)

(52) U.S. Cl.
CPC ........... *H10N 60/124* (2023.02); *H10N 60/30* (2023.02); *H10N 69/00* (2023.02); *H10N 60/35* (2023.02)

(56) References Cited

U.S. PATENT DOCUMENTS

| | | |
|---|---|---|
| 3,283,282 A | 11/1966 | Rosenberg |
| 4,336,561 A | 6/1982 | Murphy |
| 4,365,317 A | 12/1982 | Gheewala |
| 4,509,146 A | 4/1985 | Wang et al. |
| 4,647,954 A | 3/1987 | Graf et al. |
| 4,989,051 A | 1/1991 | Whitehead et al. |
| 5,026,682 A | 6/1991 | Clark et al. |
| 5,030,614 A | 7/1991 | Hollander et al. |
| 5,030,617 A | 7/1991 | Legge |
| 5,041,880 A | 8/1991 | Nojima et al. |
| 5,051,787 A | 9/1991 | Hasegawa |
| 5,053,383 A | 10/1991 | Short et al. |
| 5,127,928 A | 7/1992 | Farries et al. |
| 5,173,620 A | 12/1992 | Fujimaki et al. |
| 5,219,826 A | 6/1993 | Kapitulnik |
| 5,247,475 A | 9/1993 | Hasunuma et al. |
| 5,321,004 A | 6/1994 | Perez et al. |
| 5,365,476 A | 11/1994 | Mukhanov |
| 5,376,626 A | 12/1994 | Drehman et al. |
| 5,455,519 A | 10/1995 | Ohori |
| 5,481,119 A | 1/1996 | Higashino et al. |
| 5,521,862 A | 5/1996 | Frazier |
| 5,574,290 A | 11/1996 | You |
| 5,719,105 A | 2/1998 | Odagawa et al. |
| 5,825,240 A | 10/1998 | Geis et al. |
| 5,831,278 A | 11/1998 | Berkowitz |
| 5,892,644 A | 4/1999 | Evans |
| 5,925,892 A | 7/1999 | Mizuno et al. |
| 6,029,075 A | 2/2000 | Das et al. |
| 6,078,517 A | 6/2000 | Herr |
| 6,242,939 B1 | 6/2001 | Nagasawa |
| 6,433,974 B2 | 8/2002 | Heismann |
| 6,774,463 B1 | 8/2004 | Chaudhari et al. |
| 6,900,714 B1 | 5/2005 | Huang et al. |
| 7,227,438 B2 | 6/2007 | Song et al. |
| 7,513,765 B2 | 4/2009 | Liao |
| 7,558,030 B2 | 7/2009 | Lee et al. |
| 7,589,323 B2 | 9/2009 | Tanaka et al. |
| 7,724,083 B2 | 5/2010 | Herring et al. |
| 7,847,282 B2 | 12/2010 | Sandhu |
| 7,852,106 B2 | 12/2010 | Herr et al. |
| 8,330,145 B2 | 12/2012 | Wakana et al. |
| 8,565,844 B2 | 10/2013 | Smith |
| 8,577,430 B1 | 11/2013 | Smith |
| 8,736,085 B2 | 5/2014 | Sines |
| 9,293,240 B2 | 3/2016 | Kroulik |
| 9,443,576 B1 | 9/2016 | Miller |
| 9,500,519 B2 | 11/2016 | Tang et al. |
| 9,509,315 B2 | 11/2016 | McCaughan et al. |
| 9,798,219 B2 | 10/2017 | Pant et al. |
| 9,853,645 B1 | 12/2017 | Mukhanov et al. |
| 9,876,505 B1 | 1/2018 | Dai et al. |
| 9,954,158 B2 | 4/2018 | You et al. |
| 9,998,122 B2 | 6/2018 | Hamilton et al. |
| 10,103,736 B1 | 10/2018 | Powell et al. |
| 10,133,986 B1 | 11/2018 | Newton et al. |
| 10,171,086 B2 | 1/2019 | McCaughan et al. |
| 10,177,298 B1 | 1/2019 | Taylor et al. |
| 10,186,858 B2 | 1/2019 | Klaus et al. |
| 10,197,440 B2 | 2/2019 | Najafi |
| 10,262,776 B2 | 4/2019 | Choi et al. |
| 10,361,703 B2 | 7/2019 | Najafi |
| 10,374,611 B2 | 8/2019 | Najafi |
| 10,386,229 B2 | 8/2019 | Najafi et al. |
| 10,396,733 B2 | 8/2019 | Najafi et al. |
| 10,454,014 B2 | 10/2019 | Najafi et al. |
| 10,454,016 B2 | 10/2019 | Fong et al. |
| 10,566,516 B2 | 2/2020 | Najafi |
| 10,573,800 B1 | 2/2020 | Najafi |
| 10,586,910 B2 | 3/2020 | Najafi |
| 10,620,044 B2 | 4/2020 | Thompson et al. |
| 10,651,325 B2 | 5/2020 | Najafi et al. |
| 10,879,905 B2 | 12/2020 | Najafi et al. |
| 10,897,235 B2 | 1/2021 | Najafi et al. |
| 10,911,031 B2 | 2/2021 | Wise et al. |
| 10,944,403 B2 | 3/2021 | Najafi |
| 10,984,857 B2 | 4/2021 | Najafi |
| 11,009,387 B2 | 5/2021 | Chung et al. |
| 11,133,805 B2 | 9/2021 | Najafi |
| 11,621,714 B2 | 4/2023 | Najafi |
| 2002/0149453 A1 | 10/2002 | Snitchler et al. |
| 2003/0087503 A1 | 5/2003 | Sakaguchi et al. |
| 2005/0153843 A1 | 7/2005 | Kubota |
| 2005/0197254 A1 | 9/2005 | Stasiak et al. |
| 2006/0073979 A1 | 4/2006 | Thieme et al. |
| 2006/0183327 A1 | 8/2006 | Moon |
| 2006/0270224 A1 | 11/2006 | Song et al. |
| 2008/0026234 A1 | 1/2008 | Sambasivan et al. |
| 2008/0197285 A1 | 8/2008 | Frey et al. |
| 2008/0272302 A1 | 11/2008 | Frey et al. |
| 2009/0014433 A1 | 1/2009 | O'Neil et al. |
| 2010/0026447 A1 | 2/2010 | Keefe et al. |
| 2010/0171098 A1 | 7/2010 | Suzuki |
| 2011/0108803 A1 | 5/2011 | Deligianni et al. |
| 2011/0116742 A1 | 5/2011 | Chang et al. |
| 2011/0254053 A1 | 10/2011 | Goupil et al. |
| 2013/0012392 A1 | 1/2013 | Tanaka et al. |
| 2013/0090244 A1 | 4/2013 | Shinzato et al. |
| 2013/0124112 A1 | 5/2013 | Heath et al. |
| 2013/0143744 A1* | 6/2013 | Marsili ................. H10N 60/84 716/122 |
| 2013/0341594 A1 | 12/2013 | Mohseni et al. |
| 2014/0113828 A1 | 4/2014 | Gilbert et al. |
| 2014/0299751 A1 | 10/2014 | Tang et al. |
| 2015/0018218 A1 | 1/2015 | Lakrimi et al. |
| 2015/0179916 A1 | 6/2015 | Pramanik et al. |
| 2015/0348681 A1 | 12/2015 | Huh |
| 2016/0028402 A1 | 1/2016 | McCaughan et al. |
| 2016/0028403 A1* | 1/2016 | McCaughan ........ H10N 60/205 326/104 |
| 2016/0356708 A1 | 12/2016 | Bennett et al. |
| 2017/0186933 A1 | 6/2017 | Sunter et al. |
| 2018/0033944 A1 | 2/2018 | Ladizinsky et al. |
| 2018/0145664 A1 | 5/2018 | Herr et al. |
| 2018/0231868 A1 | 8/2018 | Grice et al. |
| 2018/0335343 A1 | 11/2018 | Najafi et al. |
| 2018/0364097 A1 | 12/2018 | Najafi |
| 2018/0374979 A1 | 12/2018 | Nozawa |
| 2019/0027672 A1 | 1/2019 | Megrant |
| 2019/0035904 A1 | 1/2019 | Najafi |
| 2019/0035999 A1 | 1/2019 | Najafi |
| 2019/0044051 A1 | 2/2019 | Caudillo et al. |
| 2019/0109595 A1 | 4/2019 | Najafi |
| 2019/0227230 A1 | 7/2019 | Novack et al. |

(56) References Cited

U.S. PATENT DOCUMENTS

| | | | |
|---|---|---|---|
| 2019/0288132 | A1 | 9/2019 | Wang et al. |
| 2019/0378874 | A1 | 12/2019 | Rosenblatt et al. |
| 2020/0066962 | A1 | 2/2020 | Najafi |
| 2020/0080890 | A1 | 3/2020 | Najafi et al. |
| 2020/0111944 | A1 | 4/2020 | Moodera et al. |
| 2020/0176662 | A1 | 6/2020 | Dayton et al. |
| 2020/0194656 | A1 | 6/2020 | Najafi |
| 2020/0256722 | A1 | 8/2020 | Najafi et al. |
| 2021/0183767 | A1 | 6/2021 | Najafi et al. |
| 2021/0239518 | A1 | 8/2021 | Chung et al. |

FOREIGN PATENT DOCUMENTS

| | | |
|---|---|---|
| DE | 2440576 B1 | 1/1976 |
| DE | 19714191 C1 | 7/1998 |
| EP | 0299879 A2 | 1/1989 |
| EP | 1965184 A1 | 9/2008 |
| GB | 2530500 A | 3/2016 |
| JP | S63299282 A | 12/1988 |
| JP | H0555647 A | 3/1993 |
| WO | WO90/14715 A1 | 11/1990 |
| WO | WO94/09566 A1 | 4/1994 |
| WO | WO/2012052628 A1 | 4/2012 |

OTHER PUBLICATIONS

Atikian, Haig A. et al., "Superconducting Nanowire Single Photon Detector on Diamond," arXiv:1401.4490v1, physics.optics, Jan. 17, 2014, 5 pgs.

Chen, Risheng et al., "Photon-Number-Resolving Detector Based on Superconducting Serial Nanowires," IEEE Transactions on Applied Superconductivity, vol. 23, No. 1, Feb. 2013, 9 pgs.

Clem, John R. et al., "Geometry-dependent critical currents in superconducting nanocircuits," arXiv:1109.4881v1 [cond-mat.supr-con] Sep. 22, 2011, 29 pgs.

Dai, Daoxin et al., "Mode conversion in tapered submicron silicon ridge optical waveguides," Optics Express, vol. 20, No. 12, Jun. 4, 2012, 15 pgs.

Henrich, D. et al., "Geometry-inducted reduction of the critical current in superconducting nanowires," arXiv:1204.0616v2 [cond-mat-supr-con] Aug. 22, 2012, 6 pgs.

Hortensius, H.L. et al., "Critical-Current Reduction in Thin Superconducting Wires Due to Current Crowding," arXiv:1203.4253v3, [cond-mat-supr-con], May 6, 2012, 5 pgs.

Korzh, B.A. et al., "Demonstrating sub-3 ps temporal resolution in a superconducting nanowire single-photon detector," Apr. 18, 2018, 26 pgs.

Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S0167931701004269.

Marsili, F., "Single-photon detectors based on ultra-narrow superconducting nanowires," Massachusetts Institute of Technology, Department of Electrical Engineering and Computer Science, Dec. 19, 2010, 31 pgs.

Mattioli, Francesco et al., "Photon-number-resolving superconducting nanowire detectors," Superconductor Science and Technology, Aug. 24, 2015, 16 pgs.

McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosopy in Electrical Engineering, 22 pgs.

Murphy et al., "Nanoscale superconducting memory based on the kinetic inductance of asymmetric nanowire loops," Department of Physics, University of Illinois at Urbana-Champaign, arXiv:1701.08715v2 [cond-mat.supr-con] Jun. 29, 2017, 19 pgs.

Natarajan et al., "Superconducting nanowire single-photon detectors: physics and applications", 2012, Superconduc. Sci. Technology vol. 25, p. 063001.

Quaranta et al., Superconductive Three-Terminal Amplifier/Discriminator, IEEE Transactions on Applied Superconductivity, vol. 19, No. 3, Jun. 2, 2009, 4 pgs.

Schmidt, E. et al., AlN-Buffered Superconducting NbN Nanowire Single-Photon Detector on GaAs, IEEE Transactions on Applied Superconductivity, vol. 27, No. 4, Jun. 2017, 5 pgs.

Shiino, Tatsuya et al., "Improvement of Critical Temperature of Superconducting NbTiN and NbN Thin Films Using the AlN Buffer Layer," Superconductor Science and Technology, Mar. 2010, 11 pgs.

Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.

Stanfield, CMOS-Compatible, Piezo-Optomechanically Tunable Photonics for Visible Wavelengths and Cryogenic, Temperatures, vol. 27, Issue 20, pp. 28588-28605, 2019.

McCaughan, A.N., et al., "Using Geometry to Sense Current," Nano Letters 16 (2016), 6 pgs.

PsiQuantum Corp., International Search Report and Written Opinion, PCT/US2018/033042, Aug. 28, 2018, 13 pgs.

PsiQuantum Corp., International Search Report and Written Opinion, PCT/US2018/033041, Jul. 27, 2018, 16 pgs.

PsiQuantum Corp., International Search Report and Written Opinion, PCT/US2018/044091, Nov. 7, 2018, 12 pgs.

PsiQuantum Corp., Invitation to Pay Additional Fees/Partial Search Report, PCT/US2018/037892, Aug. 20, 2018, 16 pgs.

PsiQuantum Corp., Invitation to Pay Additional Fees/Partial Search Report, PCT/US2018/054414, Jan. 24, 2019, 21 pgs.

PsiQuantum Corp., International Search Report and Written Opinion, PCT/US2018/054414, Mar. 20, 2019, 21 pgs.

PsiQuantum Corp., International Preliminary Report on Patentability, PCT/US2018/054414, Apr. 8, 2020, 15 pgs.

Najafi, Office Action, U.S. Appl. No. 16/028,288, Dec. 12, 2018, 6 pgs.

Najafi, Notice of Allowance, U.S. Appl. No. 16/028,288, Apr. 5, 2019, 10 pgs.

Najafi, Office Action, U.S. Appl. No. 16/028,293, Sep. 21, 2018, 8 pgs.

Najafi, Final Office Action, U.S. Appl. No. 16/028,293, Mar. 1, 2019, 5 pgs.

Najafi, Notice of Allowance, U.S. Appl. No. 16/012,520, Sep. 21, 2018, 9 pgs.

Najafi, Office Action, U.S. Appl. No. 16/136,124, Apr. 4, 2019, 9 pgs.

Najafi, Quayle Office Action, U.S. Appl. No. 16/151,180, Jan. 31, 2019, 5 pgs.

Najafi, Notice of Allowace, U.S. Appl. No. 16/151,180, Mar. 14, 2019, 5 pgs.

Najafi, Notice of Allowance, U.S. Appl. No. 16/151,190, Feb. 6, 2019, 11 pgs.

Najafi, Notice of Allowance U.S. Appl. No. 16/151,190, Mar. 28, 2019, 5 pgs.

Najafi, Office Action, U.S. Appl. No. 16/046,815, Feb. 4, 2019, 9 pgs.

Najafi, Office Action, U.S. Appl. No. 16/046,807, Mar. 18, 2019, 10 pgs.

Najafi, Office Action, U.S. Appl. No. 16/107,143, Mar. 19, 2019, 11 pgs.

Psiquantum Corp., International Search Report and Written Opinion, PCT/US2019/017687, Apr. 30, 2019, 8 pgs.

Psiquantum Corp., International Search Report and Search Report, PCT/US2019/017691, Apr. 23, 2019, 7 pgs.

Psiquantum Corp., International Search Report and Written Opinion, PCT/US2019/030019, Jul. 17, 2019, 8 pgs.

Psiquantum Corp., International Preliminary Report on Patentability, PCT/US2018/044091, Jan. 28, 2020, 6 pgs.

Najafi, Non-Final Office Action, U.S. Appl. No. 16/664,716, Apr. 1, 2020, 14 pgs.

Psiquantum, International Search Report and Written Opinion, PCT/US2019/051853, Jan. 27, 2020, 13 pgs.

Psiquantum, International Preliminary Report on Patentability, PCT/US12018/033041, Nov. 26, 2019, 8 pgs.

(56) References Cited

OTHER PUBLICATIONS

Psiquantum, Invitation to Pay Additional Fees/Partial Search Report, PCT/US2018/037892, Oct. 17, 2018, 18 pgs.
Psiquantum, International Search Report and Written Opinion, PCT/US2018/037892, Dec. 17, 2019, 12 pgs.
Najafi, Non-Final Office Action, U.S. Appl. No. 16/553,068, Apr. 1, 2020, 11 pgs.
Najafi, Non-Final Office Action, U.S. Appl. No. 16/544,718, Aug. 17, 2020, 6 pgs.
Najafi, Non-Final Office Action, U.S. Appl. No. 16/656,506, Aug. 13, 2020, 18 pgs.
Najafi, Notice of Allowance, U.S. Appl. No. 16/553,068, Sep. 18, 2020, 8 pgs.
Najafi, Notice of Allowance, U.S. Appl. No. 16/473,550, Sep. 24, 2020, 8 pgs.
Najafi, Notice of Allowance, U.S. Appl. No. 16/473,550, Nov. 3, 2020, 2 pgs.
Najafi, Notice of Allowance, U.S. Appl. No. 16/553,068, Nov. 12, 2020, 2 pgs.
Najafi, Notice of Allowance, U.S. Appl. No. 16/656,506, Nov. 3, 2020, 12 pgs.
Najafi, Final Office Action, U.S. Appl. No. 16/664,716, Oct. 16, 2020, 14 pgs.
Najafi, Notice of Allowance, U.S. Appl. No. 16/473,547, Dec. 9, 2020, 8 pgs.
Najafi, Notice of Allowance, U.S. Appl. No. 16/543,256, Dec. 9, 2020, 12 pgs.
Chung, Non-Final Office Action, U.S. Appl. No. 16/849,829, Aug. 21, 2020, 5 pgs.
Chung, Notice of Allowance, U.S. Appl. No. 16/849,829, Dec. 8, 2020, 5 pgs.
Psiquantum Corp., International Search Report and Written Opinion, PCT/US20/28519, Jan. 12, 2021, 9 pgs.
Psiquantum Corp., Notice of Allowance, U.S. Appl. No. 16/849,829, Mar. 1, 2021, 8 pgs.
Psiquantum Corp., Notice of Allowance, U.S. Appl. No. 16/544,718, Feb. 5, 2021, 6 pgs.
Psiquantum Corp., Notice of Allowance, U.S. Appl. No. 16/664,716, Jan. 28, 2021, 8 pgs.
Psiquantum Corp., Notice of Allowance, U.S. Appl. No. 16/473,547, Jan. 27, 2021, 2 pgs.
Psiquantum Corp., Notice of Allowance, U.S. Appl. No. 16/543,256, Feb. 4, 2021, 2 pgs.
Psiquantum Corp., Notice of Allowance, U.S. Appl. No. 16/544,718, Mar. 12, 2021, 2 pgs.
Psiquantum Corp., Notice of Allowance, U.S. Appl. No. 16/544,718, Mar. 24, 2021, 2 pgs.
Psiquantum Corp., Notice of Allowance, U.S. Appl. No. 16/849,829, Apr. 5, 2021, 2 pgs.
Psiquantum, Notice of Allowance, U.S. Appl. No. 16/840,166, Mar. 23, 2021, 7 pgs.
Psiquantum, Notice of Allowance, U.S. Appl. No. 16/544,718, Apr. 26, 2021, 2 pgs.
Psiquantum, Notice of Allowance, U.S. Appl. No. 16/664,716, Apr. 21, 2021, 8 pgs.
Psiquantum, Notice of Allowance, U.S. Appl. No. 16/664,716, May 7, 2021, 2 pgs.
Psiquantum, Notice of Allowance, U.S. Appl. No. 16/543,256, Mar. 24, 2021, 2 pgs.
Psiquantum, Notice of Allowance, U.S. Appl. No. 16/575,274, Apr. 22, 2021, 10 pgs.
Psiquantum, International Preliminary Report on Patentability, PCT/US2018/033042, Nov. 19, 2019, 7 pgs.
Psiquantum, International Preliminary Report on Patentability, PCT/US2019/051853, Mar. 23, 2021, 10 pgs.
Psiquantum, International Preliminary Report on Patentability, PCT/US2019/017687, Aug. 18, 2020, 6 pgs.
Psiquantum, International Preliminary Report on Patentability, PCT/US2019/030019, Nov. 3, 2020, 7 pgs.
Psiquantum, Notice of Allowance, U.S. Appl. No. 16/840,166, May 24, 2021, 5 pgs.
Najafi, Notice of Allowance, U.S. Appl. No. 16/840,166, Jul. 21, 2021, 2 pgs.
Najafi, Non-Final Office Action, U.S. Appl. No. 17/135,861, Sep. 23, 2021, 6 pgs.
Psiquantum, International Preliminary Report on Patentability, PCT/US2019/016885, Aug. 11, 2020, 7 pgs.
Psiquantum, International Search Report and Written Opinion, PCT/US2019/016885, Apr. 24, 2019, 9 pgs.
Thompson, Non-Final Office Action, U.S. Appl. No. 16/450,911, Aug. 2, 2019, 6 pgs.
Thompson, Notice of Allowance, U.S. Appl. No. 16/450,911, Dec. 11, 2019, 5 pgs.
Thompson, Non-Final Office Action, U.S. Appl. No. 16/985,137, Sep. 30, 2021, 6 pgs.
Najafi, Notice of Allowance, U.S. Appl. No. 16/046,807, Oct. 29, 2019, 7 pgs.
Najafi, Non-Final Office Action, U.S. Appl. No. 16/136,124, Apr. 4, 2019, 8 pgs.
Najafi, Notice of Allowance, U.S. Appl. No. 16/136,124, Jun. 27, 2019, 8 pgs.
Najafi, Corrected Notice of Allowance, U.S. Appl. No. 16/136,124, Sep. 23, 2019, 2 pgs.
Psiquantum Corp., International Search Report and Written Opinion, PCT/US2018/060802, Apr. 8, 2019, 6 pgs.
Psiquantum, International Preliminary Report on Patentability, PCT/US2018/060802, May 19, 2020, 13 pgs.
Najafi, Notice of Allowance, U.S. Appl. No. 16/773,921, Sep. 22, 2021, 8 pgs.
Najafi, Notice of Allowance, U.S. Appl. No. 17/195,522, Nov. 12, 2021, 8 pgs.
Najafi, Notice of Allowance, U.S. Appl. No. 17/195,522, Nov. 16, 2021, 2 pgs.
Najafi, Notice of Allowance, U.S. Appl. No. 16/773,921, Nov. 15, 2021, 8 pgs.
Najafi, Notice of Allowance, U.S. Appl. No. 17/033,337, Dec. 9, 2021, 8 pgs.
Chung, Non-Final Office Action, U.S. Appl. No. 17/232,086, Dec. 16, 2021, 6 pgs.
Chung, Notice of Allowance, U.S. Appl. No. 17/232,086, May 11, 2022, 6 pgs.
Najafi, Notice of Allowance, U.S. Appl. No. 17/195,522, Dec. 9, 2021, 2 pgs.
Najafi, Notice of Allowance, U.S. Appl. No. 16/773,921, Dec. 24, 2021, 2 pgs.
Najafi, Notice of Allowance, U.S. Appl. No. 17/195,522, Jan. 7, 2022, 2 pgs.
Najafi, Notice of Allowance, U.S. Appl. No. 17/135,861, Jan. 28, 2022, 7 pgs.
Thompson, Non-Final Office Action, U.S. Appl. No. 16/985,137, Jan. 18, 2022, 8 pgs.
Najafi, Notice of Allowance, U.S. Appl. No. 16/623,503, Feb. 22, 2022, 10 pgs.
Najafi, Notice of Allowance, U.S. Appl. No. 17/195,522, Feb. 9, 2022, 2 pgs.
Najafi, Notice of Allowance, U.S. Appl. No. 17/135,861, Feb. 15, 2022, 2 pgs.
Najafi, Notice of Allowance, U.S. Appl. No. 16/773,921, Feb. 16, 2022, 2 pgs.
Najafi, Notice of Allowance, U.S. Appl. No. 17/033,337, Feb. 25, 2022, 7 pgs.
Najafi, Non-Final Office Action, U.S. Appl. No. 16/813,628, Mar. 7, 2022, 7 pgs.
Najafi, Notice of Allowance, U.S. Appl. No. 17/033,337, Mar. 16, 2022, 2 pgs.
Najafi, Notice of Allowance, U.S. Appl. No. 17/135,861, Mar. 15, 2022, 2 pgs.
Najafi, Notice of Allowance, U.S. Appl. No. 16/623,503, Mar. 11, 2022, 3 pgs.
Najafi, Notice of Allowance, U.S. Appl. No. 16/623,503, Mar. 22, 2022, 3 pgs.

(56) References Cited

OTHER PUBLICATIONS

Najafi, Non-Final Office Action, U.S. Appl. No. 17/160,283, Mar. 31, 2022, 18 pgs.
Najafi, Non-Final Office Action, U.S. Appl. No. 17/234,701, Feb. 1, 2022, 14 pgs.
Najafi, Non-Final Office Action, U.S. Appl. No. 16/840,182, Apr. 29, 2022, 12 pgs.
Najafi, Non-Final Office Action, U.S. Appl. No. 16/623,503, Jun. 23, 2021, 15 pgs.

* cited by examiner

SUPERCONDUCTING LOGIC CIRCUITS

RELATED APPLICATIONS

This application is a continuation of U.S. patent application Ser. No. 17/486,615, filed Sep. 27, 2021, is a continuation of U.S. patent application Ser. No. 16/840,166, filed Apr. 3, 2020, now U.S. Pat. No. 11,133,805, which is a continuation of PCT International Application No. PCT/US2018/054414, filed Oct. 4, 2018, which claims priority to U.S. patent application Ser. No. 16/151,180, filed Oct. 3, 2018, now U.S. Pat. No. 10,361,703; U.S. patent application Ser. No. 16/151,190, filed Oct. 3, 2018, now U.S. Pat. No. 10,374,611; U.S. Provisional Application No. 62/630,657, filed Feb. 14, 2018; U.S. Provisional Application No. 62/585,519, filed Nov. 13, 2017; and U.S. Provisional Application No. 62/568,677, filed Oct. 5, 2017, each of which is hereby incorporated by reference in its entirety.

This application is also related to U.S. patent application Ser. No. 16/136,124, filed Sep. 19, 2018, now U.S. Pat. No. 10,461,445, which is hereby incorporated by reference in its entirety.

TECHNICAL FIELD

This relates generally to superconducting circuits, including but not limited to, superconducting circuits implementing logic gates.

BACKGROUND

Logic gates are used to implement Boolean functions and perform logical operations on one or more inputs to produce an output. Thus, logic gates are essential components in many electronic devices. Additionally, superconductors are materials capable of operating in a superconducting state with zero electrical resistance under particular conditions.

SUMMARY

There is a need for systems and/or devices with more efficient and effective methods for implementing logical operations. Such systems, devices, and methods optionally complement or replace conventional systems, devices, and methods for implementing logical operations.

Utilizing a single circuit to implement multiple logical functions (e.g., AND, OR, and Majority Gate functions) decreases design complexity and allows the ability to switch between the logical functions during operation of the device. Utilizing superconductor(s) to implement the circuit allows the circuit to operate at cryogenic temperatures and at nanoscale sizes. Accordingly, some embodiments include a circuit including multiple superconducting wires in parallel, where each wire is connected to a respective input port, e.g., via a resistor. Based on the value of a bias current, this circuit can act as a logical OR gate, a logical AND gate, or majority gate.

In one aspect, some embodiments include an electric circuit having: (1) a plurality of superconducting components; (2) a plurality of circuits coupled in parallel with one another, each circuit of the plurality of circuits including a respective superconducting component of the plurality of superconducting components; (3) a plurality of current sources, each current source of the plurality of current sources coupled to a corresponding superconducting component of the plurality of superconducting components and configured to selectively provide a first current; (4) a first current source coupled to the plurality of circuits, the first current source configured to selectively provide: (a) a second current adapted to bias the plurality of superconducting components such that a combination of the second current and the first current from any current source of the plurality of current sources causes the plurality of superconducting components to transition from a superconducting state to a non-superconducting state; and (b) a third current adapted to bias the plurality of superconducting components such that a combination of the third current and the first current from each current source of the plurality of current sources causes the plurality of superconducting components to transition from a superconducting state to a non-superconducting state; and (5) an output node adapted to output a respective current while the plurality of superconducting components are in the non-superconducting state; where the electric circuit functions as a logical OR gate while the first current source provides the second current; and the electric circuit functions as a logical AND gate while the first current source provides the third current. In some embodiments, the second current is in the range of 1 microamp to 20 microamps per superconducting component. In some embodiments, the third current is in the range of 1 microamp to 20 microamps per superconducting component. In some embodiments, each first current is in the range of 1 microamp to 20 microamps per superconducting component. In some embodiments, the respective first current for each current source is distinct.

In another aspect, some embodiments include an electric circuit having: (1) a plurality of superconducting components; (2) a plurality of circuits coupled in parallel with one another, each circuit of the plurality of circuits including a respective superconducting component of the plurality of superconducting components; and (3) a plurality of current sources coupled to the plurality of superconducting components, each current source of the plurality of current sources coupled to a corresponding superconducting component of the plurality of the superconducting components. In some embodiments, the electric circuit is configured to: (1) operate in a first mode, including providing an output current in response to receiving a first current at any of the plurality of current sources; and (2) operate in a second mode, including providing an output current only in response to receiving the first current at each of the plurality of current sources.

In yet another aspect, some embodiments include a method performed at an electric circuit having a plurality of circuits coupled in parallel with one another, each circuit of the plurality of circuits including a respective superconducting component of a plurality of superconducting components. In some embodiments, the method includes: (1) while the electric circuit is operating in a first mode: (a) providing a first current to any of the plurality of superconducting components; (b) in response to providing the current to any of the plurality of superconducting components, transitioning the plurality of superconducting components from a superconducting state to a non-superconducting state; and (c) providing a first output current; and (2) while the electric circuit is operating in a second mode: (a) providing the first current to each of one or more circuits, less than all, of the plurality of superconducting components; (b) in response to providing the first current to each of one or more superconducting components, less than all, of the plurality of superconducting components, maintaining one or more superconducting components of the plurality of superconducting components in the superconducting state; and (c) providing a second output current that is less than the first output current; (d) providing the first current to each superconducting component of the plurality of superconducting components; and (e) in response to providing the first current to each superconducting component of the plurality of superconducting components, transitioning the plurality of superconducting components into the non-superconducting state; and (f) providing the first output current.

In yet another aspect, some embodiments include a device or circuit configured to perform any of the methods disclosed herein.

Thus, devices, circuits, and systems are provided with methods for operating superconducting logic gate circuitry, thereby increasing the effectiveness, efficiency, and user satisfaction with such systems and devices.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

DETAILED DESCRIPTION

Figure 1A:
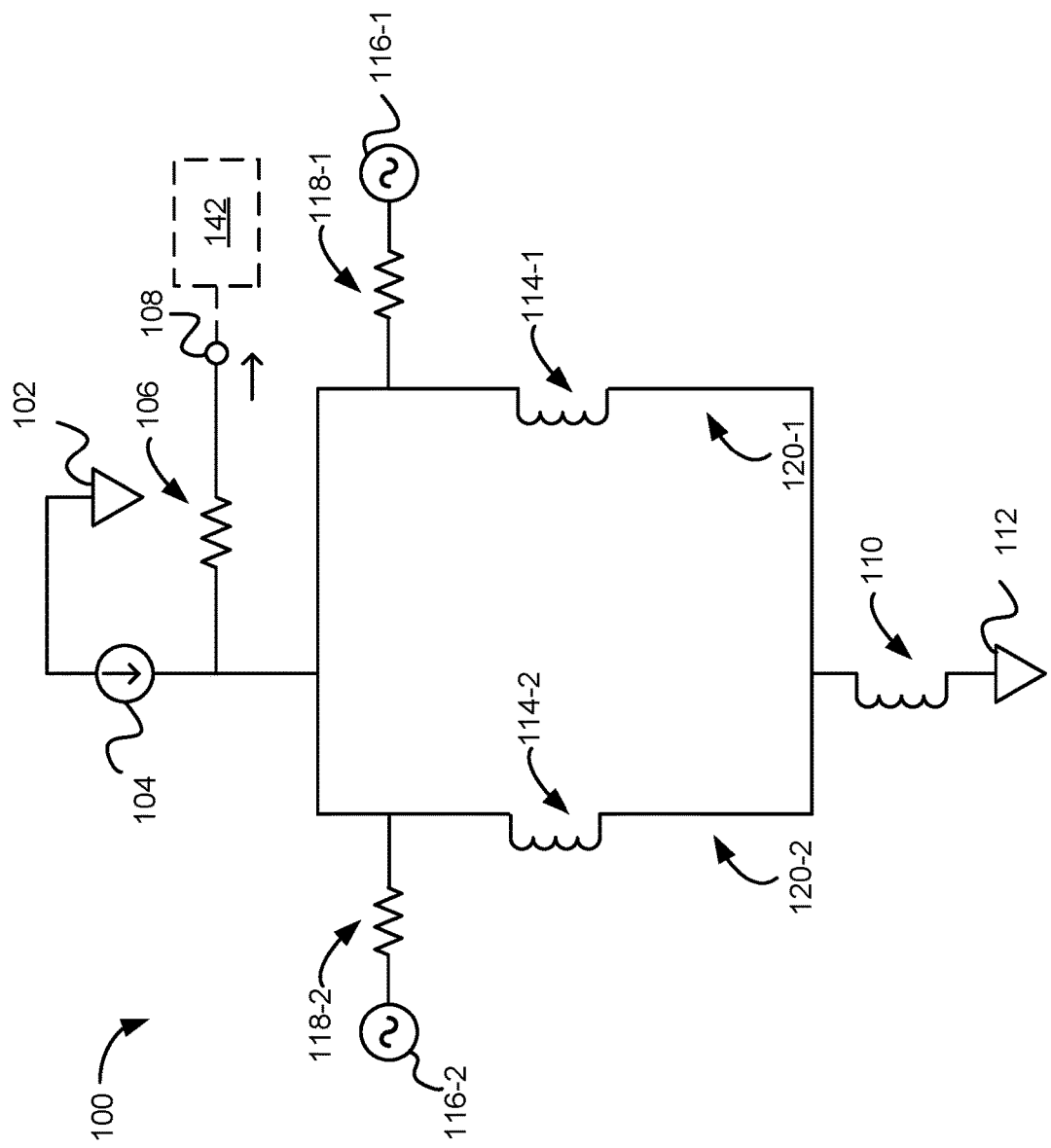
FIGS. 1A-1C are schematic diagrams illustrating representative superconducting circuits in accordance with some embodiments.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

Utilizing a single circuit to implement both logical AND functions and logical OR functions decreases design complexity and allows the ability to switch between the logical functions during operation of the device. Utilizing superconductor(s) to implement the circuit allows the circuit to operate at cryogenic temperatures and at nanoscale sizes. For example, such devices would be beneficial for low-latency logical operations directly on a cryogenic chip.

Accordingly, some embodiments include a structure including multiple superconducting wires in parallel, where each wire is connected to a respective input port, e.g., via an inductor and/or a resistor. Based on the value of a bias current, this structure acts as a logical OR gate, a logical AND gate, or a majority gate.

As used herein, a "superconducting circuit" or "superconductor circuit" is a circuit having one or more superconducting materials. For example, a superconducting photodetector circuit is a photodetector circuit that includes one or more superconducting materials. As used herein, a "superconducting" material is a material that is capable of operating in a superconducting state (under particular conditions). For example, a material that operates as a superconductor (e.g., operates with zero electrical resistance) when cooled below a particular temperature (e.g., a critical temperature) and having less than a threshold current flowing through it. A superconducting material is also called herein a superconduction-capable material. The superconducting materials may also operate in an "off" state where little or no current is present. In some embodiments, the superconducting materials operate in a non-superconducting state during which the materials have a non-zero electrical resistance (e.g., a resistance in the range of one thousand to ten thousand ohms). For example, a superconducting material supplied with a current greater than a threshold superconducting current for the superconducting material may transition from a superconducting state with zero electrical resistance to a non-superconducting state with non-zero electrical resistance. As an example, superconducting wire 104 is a superconducting material that is capable of operating in a superconducting state (e.g., under particular operating conditions).

As used herein, a "wire" is a section of material configured for transferring electrical current. In some embodiments, a wire includes a section of material conditionally capable of transferring electrical current (e.g., a wire made of a superconducting material that is capable of transferring electrical current while the wire is maintained at a temperature below a critical temperature). A cross-section of a wire (e.g., a cross-section that is perpendicular to a length of the wire) optionally has a geometric (e.g., flat or round) shape or an irregular (also sometimes called a non-geometric) shape. In some embodiments, a length of a wire is greater than a width or a thickness of the wire (e.g., the length of a wire is at least 5, 6, 7, 8, 9, or 10 times greater than the width and the thickness of the wire).

As used herein, the term "light intensity" or simply "intensity" refers to the number of photons incident on a unit area, e.g., a superconducting wire, per unit time. The term "intensity" includes a situation where only a single photon is incident on the detector in a given time period and also includes a situation where multiple photons are incident on the detector in the given time period. For example, a first light pulse having a first intensity that is greater than a second light pulse having a second intensity includes a first light pulse that includes more photons than a second light pulse. For example, the first light pulse can include 10 photons or 100 photons, while the second light pulse can include one photon, two photons, . . . , 9 photons, etc.

The present disclosure describes embodiments of superconducting logic circuits configured to receive current inputs and heat inputs. The embodiments of superconducting logic circuits configured to receive current inputs and the embodiments of superconducting logic circuits configured to receive heat inputs will be discussed in turn. Although the current and heat inputs are discussed in turn, one of skill in the art after having read the present disclosure will recognize that superconducting logic circuits could be configured to receive a combination of current and heat inputs.

Current Input Embodiments

Figure 1B:
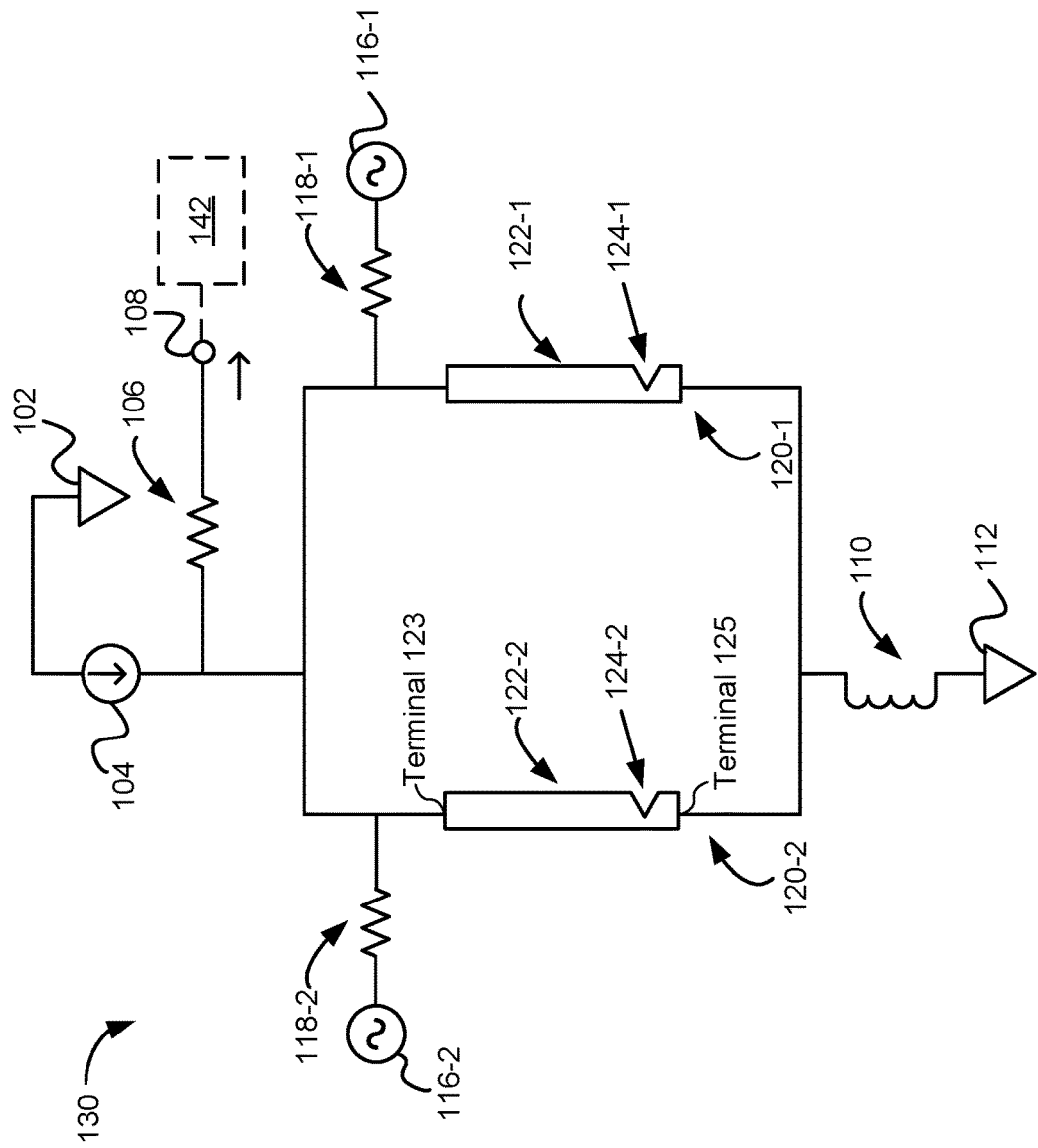
Figure 1C:
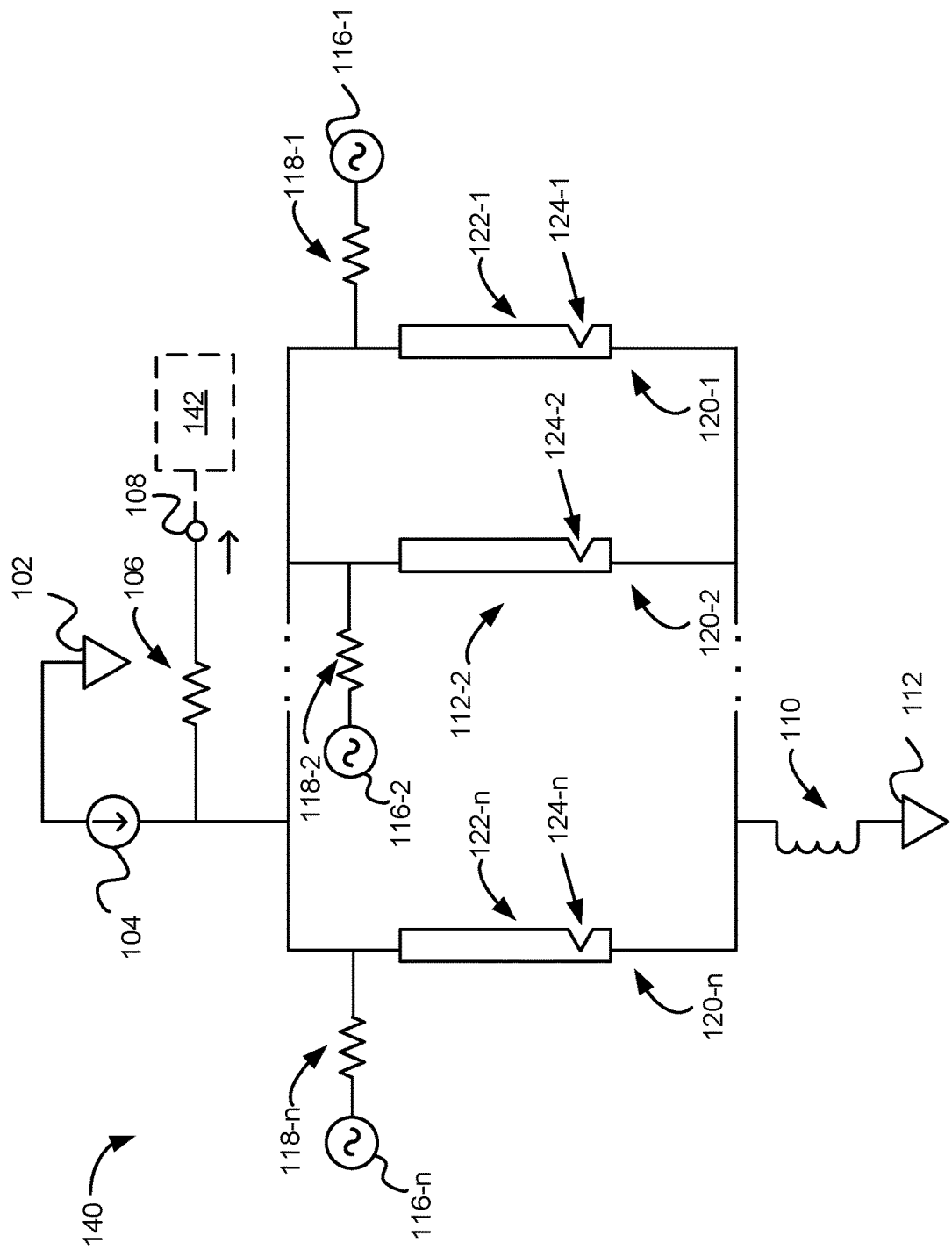

FIGS. 1A-1C are schematic diagrams illustrating representative superconducting circuits in accordance with some embodiments. FIG. 1A shows a superconducting circuit 100 having a current source 104 and a plurality of parallel circuits 120. Each parallel circuit 120 includes an inductor 114 (e.g., a kinetic inductor). Each parallel circuit 120 is coupled to a current source 116 via a resistor 118. The superconducting circuit 100 also includes an output node 108 coupled to the current source 104 via resistor 106, an inductor 110 (e.g., adapted to slow a transition from a non-superconducting state to a superconducting state in the parallel circuits 120), and electrical grounds 102 and 112. In some embodiments, one or more of the electrical grounds 102 and 112 is replaced with a reference node maintained at a non-zero voltage level. In some embodiments, (not shown) the parallel circuits 120 are coupled to one another via a resistive, inductive, and/or capacitive component. In some embodiments, a readout circuit 142 (as shown in FIG. 1A) is coupled to the output node 108. In some embodiments, the current source 104 is a direct current (DC) source. In some embodiments, one or more of the current source(s) 116 is a pulse current source. In some embodiments, one or more of the current source(s) 116 is an impulse current generator, sometimes called an impulse current source. In some embodiments, each of the one or more of the current source(s) 116 produces a high current pulse or surge in response to detection of a corresponding predefined event (e.g., triggered by detection of a photon).

In some embodiments, the inductor 110 has an inductance in the range of 1 nanohenry to 1 microhenry. In some embodiments, the inductor 110 is configured to delay a transition of the plurality of parallel circuits 120 (e.g., by 100 ps, 500 ps, or 2 ns) from a non-superconducting state to a superconducting state. In some embodiments, each resistor 106, 118 has a resistance in the range of 1 kiloohm to 10 megaohms. In some embodiments, the current source 104 supplies a current in the range of 1 microamp to 20 microamps per parallel circuit. In some embodiments, each current source 116 supplies a current in the range of 1 microamp to 20 microamps. In some embodiments, the electrical grounds 102 and 112 are electrically connected. In some embodiments, the current source 104 is configured to supply a current that is below a superconducting current threshold for each parallel circuit 120 (e.g., 70%, 80%, or 90% of the superconducting current threshold for the respective parallel circuit). In some embodiments, the resistor 106 has a resistance that is less than a respective resistance of each parallel circuit 120 the when the parallel circuits are in a non-superconducting state. In some embodiments, the resistor 106 and/or the resistors 118 each includes one or more distinct components. In some embodiments, the resistor 106 includes one or more resistances inherent in the circuitry 100 and/or the connection between circuitry 110 and a readout circuit coupled to the output node 108.

FIG. 1B shows a superconducting circuit 130 similar to the superconducting circuit 100 in FIG. 1A. However, the inductors 114 in FIG. 1A have been replaced with superconducting wires 122 in FIG. 1B. Stated another way, in FIG. 1B, each parallel circuit 120 includes a respective superconducting wire 122. In some embodiments, each parallel circuit 120 further includes one or more additional components, such as an inductive, capacitive, or resistive component. As shown in FIG. 1B, the current sources 104 and 116 are electrically-connected to a first terminal (e.g., terminal 123) of the corresponding superconducting wires 122 and the electrical ground 112 is electrically-connected to a second terminal (e.g., terminal 125) of the corresponding superconducting wires 122 (e.g., via the inductor 110). In some embodiments, the current sources 104 and 116 are coupled to the superconducting wires 122 such that the current provided by the current sources flows from the terminal 123 to the terminal 125. In some embodiments, the current sources 104 and 116 are coupled to the superconducting wires 122 such that no current from the current sources enters at a point along the respective lengths of the superconducting wires 122. In some embodiments, the current sources 104 and 116 are coupled to the superconducting wires 122 such that the current provided by the current sources 104 and 116 flows through a shared (e.g., main) channel of each superconducting wire 122, e.g., the shared channel being between the terminal 123 and the terminal 125 for superconducting wire 122-2. In some embodiments, the current sources 104 and 116 are coupled to the superconducting wires 122 such that the current provided by the current sources enters via a same terminal (e.g., terminal 123) and flows in parallel through each superconducting wire 122. In accordance with some embodiments, the terminals 123 and 125 represent an interface or node between a superconductor 122 and a non-superconducting (e.g., semi-conducting or conducting) component, such as a metal wire. In some embodiments, the circuit 130 is configured and connected such that each superconducting wire 122 is only electrically-connected at two terminals (e.g., the terminals 123 and 125).

In some embodiments, each superconducting wire 122 has a same thickness (e.g., 10 nm), while in other embodiments, the superconducting wires 122 have differing thicknesses. In some embodiments, the superconducting wires 122 are each composed of a same material (e.g., niobium or niobium alloy), while in other embodiments, the superconducting wires 122 are composed of differing materials. In some embodiments, each superconducting wire 122 has a same width (e.g., 100 nm), while in other embodiments, the superconducting wire 122 have differing widths. In some embodiments, each superconducting wire 122 has a same length (e.g., 500 nm), while in other embodiments, the superconducting wire 122 have differing widths. In some embodiments, each superconducting wire 122 is a thin-film wire. In some embodiments, each wire 122 has a width in the range of 50 nanometers to 200 nanometers. In some embodiments, each wire 122 has a length in the range of 100 nanometers to 500 nanometers. In various embodiments, the thickness, width, and length of each superconducting wire 122 is varied (e.g., independently varied) to achieve a desired superconducting current threshold for the wire.

FIG. 1B shows each superconducting wire 122 having a constriction 124. In some embodiments, each constriction 124 is defined by a narrowing of the corresponding superconducting wire 122 at a point along the length of the wire. In some embodiments, each constriction 124 is a non-superconducting material whose presence narrows the width of the corresponding wire 122. In some embodiments, one or more of the superconducting wires 122 does not include a constriction. The constrictions 124 in FIG. 1B each have a triangular shape. In some embodiments (not shown), one or more of the constrictions have another geometric shape (e.g., a triangle with one or more rounded corners, a rectangle with or without one or more rounded corners), while in other embodiments, one or more of the constrictions have an irregular shape. In some embodiments, the constriction 124 is positioned along the length of the superconducting wire remote from the terminals 123 and 125. In some embodiments, the superconducting wires 122 are arranged and shaped such that a hot spot (e.g., created due to action above a superconducting current threshold for the superconducting wire) is generated in proximity to the constriction 124 (e.g., rather than in proximity to either terminal of the superconductor).

FIG. 1C shows a superconducting circuit 140 similar to the superconducting circuit 130 in FIG. 1B. However, the superconducting circuit 140 in FIG. 1C includes a number 'n' of parallel circuits 120, each with a superconducting wire 122. The superconducting circuit 140 further includes 'n' current sources 116, each coupling to a respective parallel circuit 120. In some embodiments, the number 'n' of parallel circuit is determined based on a number of inputs for the circuit 140 and/or a desired functionality for the circuit 140.

FIGS. 2A-2E are prophetic diagrams illustrating a representative operating sequence of the superconducting circuit 130 of FIG. 1B in a first mode of operation (e.g., a logical AND mode of operation) in accordance with some embodiments. As one of skill in the art would recognize after reading the instant disclosure, the operating principles depicted in FIGS. 2A-2E also apply to the circuit 100 in FIG. 1A and the circuit 140 in FIG. 1C.

Figure 2A:
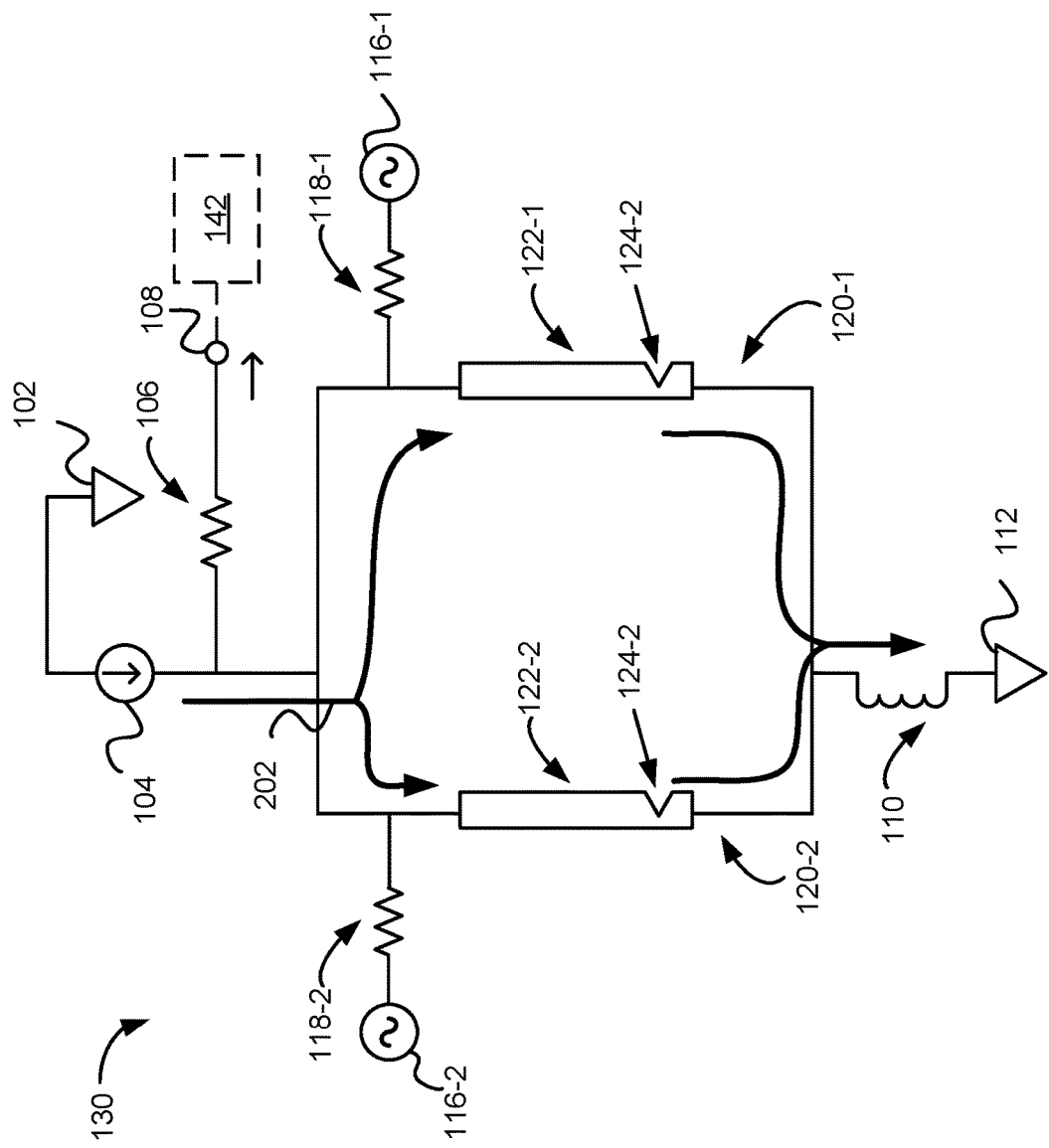
FIGS. 2A-2E are prophetic diagrams illustrating a representative operating sequence of the superconducting circuit of FIG. 1B in a first mode of operation in accordance with some embodiments.

FIG. 2A shows current 202 flowing from the current source 104 through the parallel circuits 120 and the inductor 110 to the ground 112. In some embodiments, the current 202 is configured such that each superconducting wire 122 operates in a superconducting state (e.g., having zero resistance). In some embodiments, the current 202 is less than a threshold superconducting current of each superconducting wire 122. As shown in FIG. 2A, a portion of the current 202 flows through each superconducting wire 122 and negligible current flows to the output node 108 (e.g., current below a threshold amount of output current).

Figure 2B:
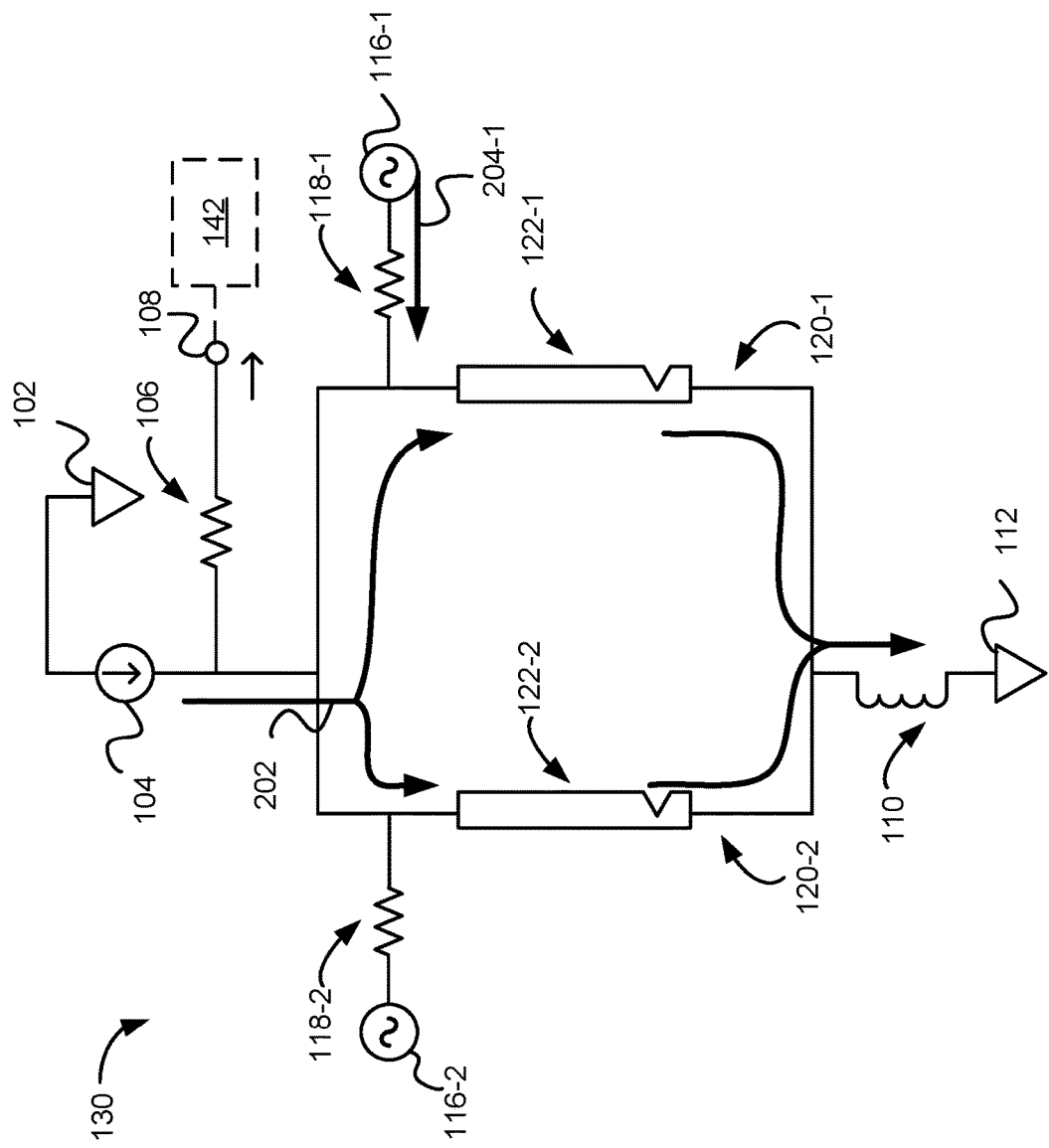
Figure 2C:
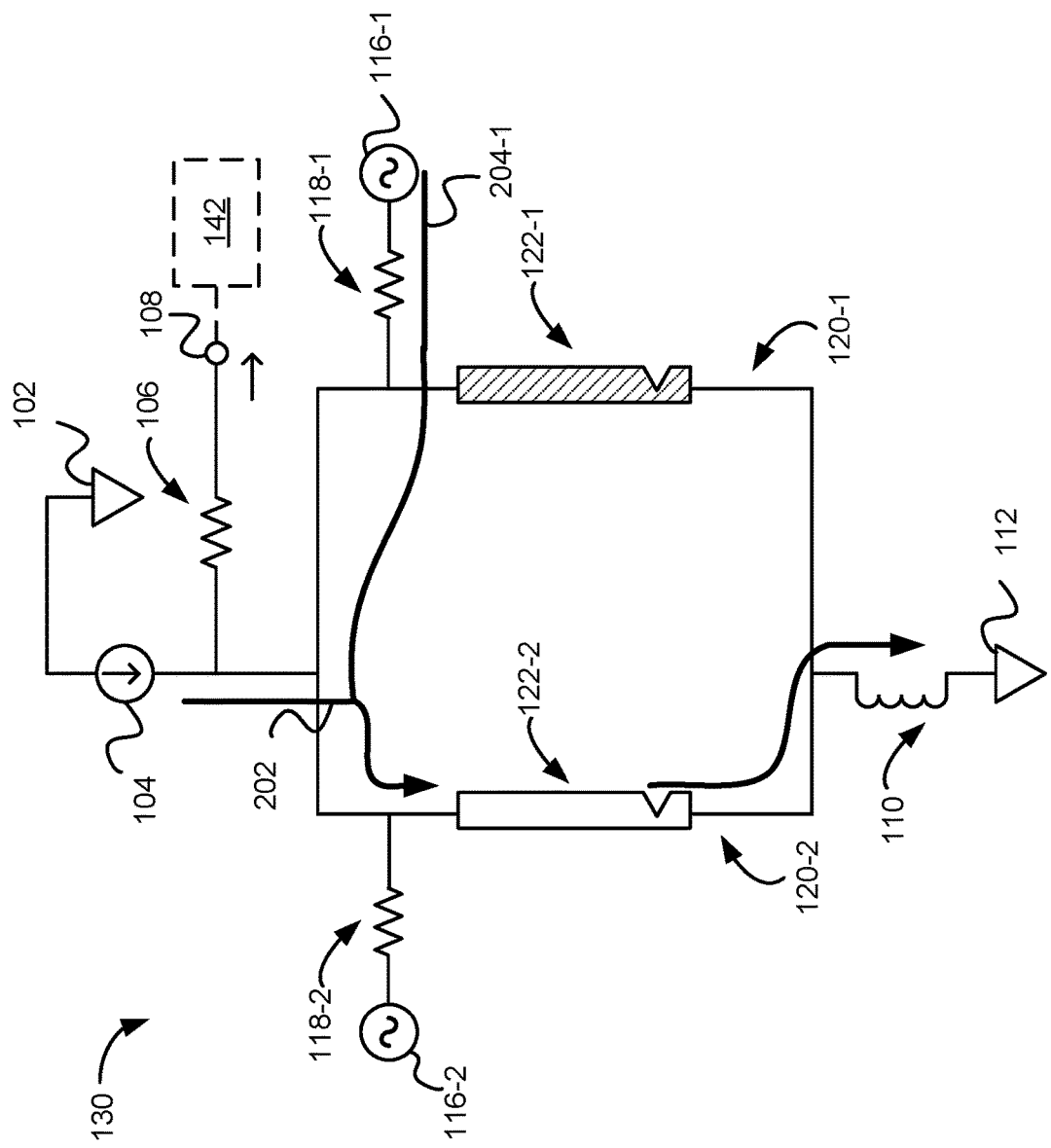

FIG. 2B shows a current 204-1 supplied by the current source 116-1 to the parallel circuit 120-1. In accordance with some embodiments, the combination of the current 204-1 and the portion of the current 202 flowing to the superconducting wire 122-1 exceeds a superconducting current threshold for the superconducting wire 122-1. Accordingly, FIG. 2C shows a resulting transition of the superconducting wire 122-1 to a non-superconducting state (denoted by the hash marks). FIG. 2C also shows currents 202 and 204-1 flowing through the parallel circuit 120-2. In accordance with some embodiments, the combination of the current 204-1 and the current 202 flowing to the superconducting wire 122-2 does not exceed a superconducting current threshold for the superconducting wire 122-2.

Figure 2D:
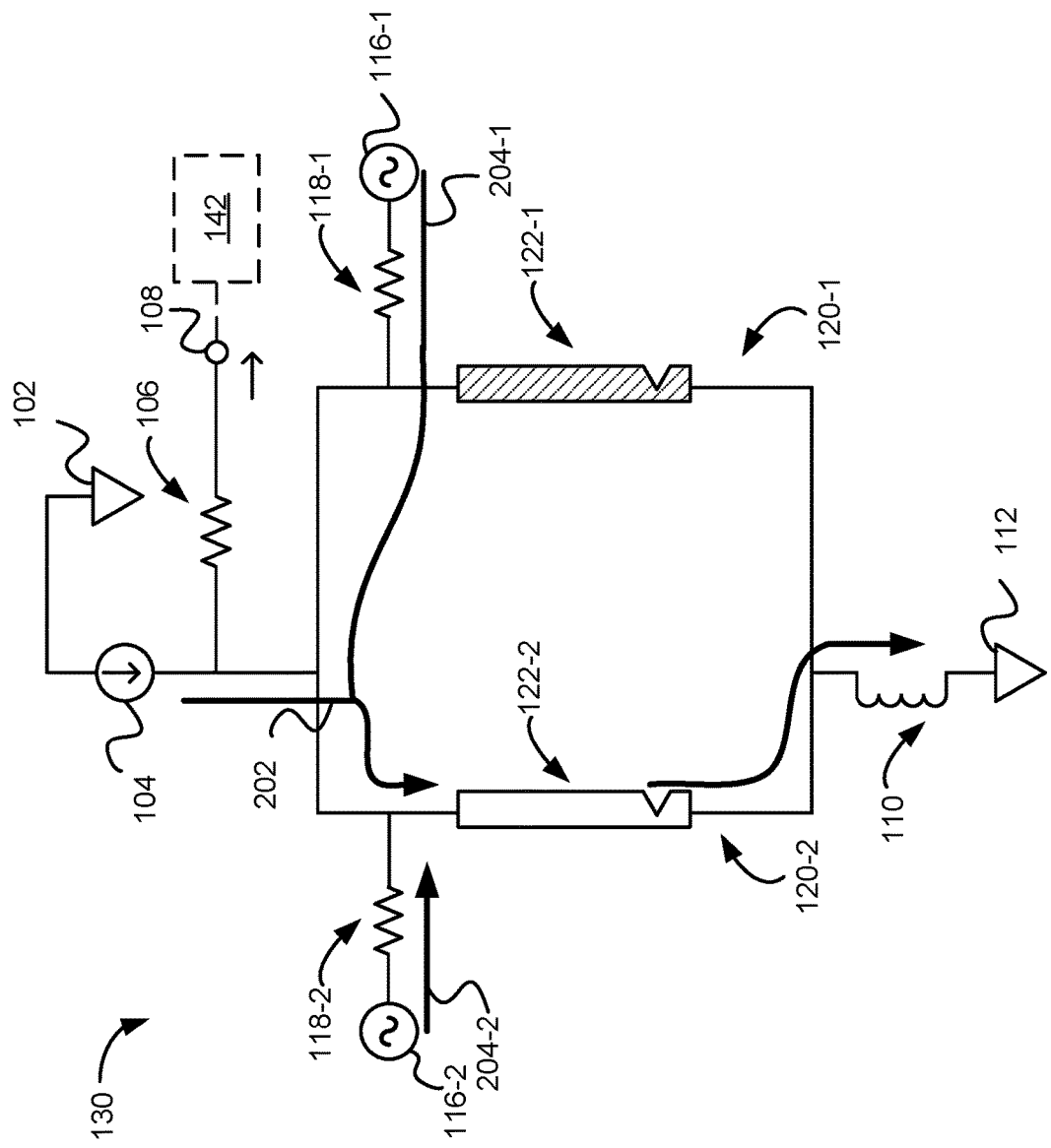
Figure 2E:
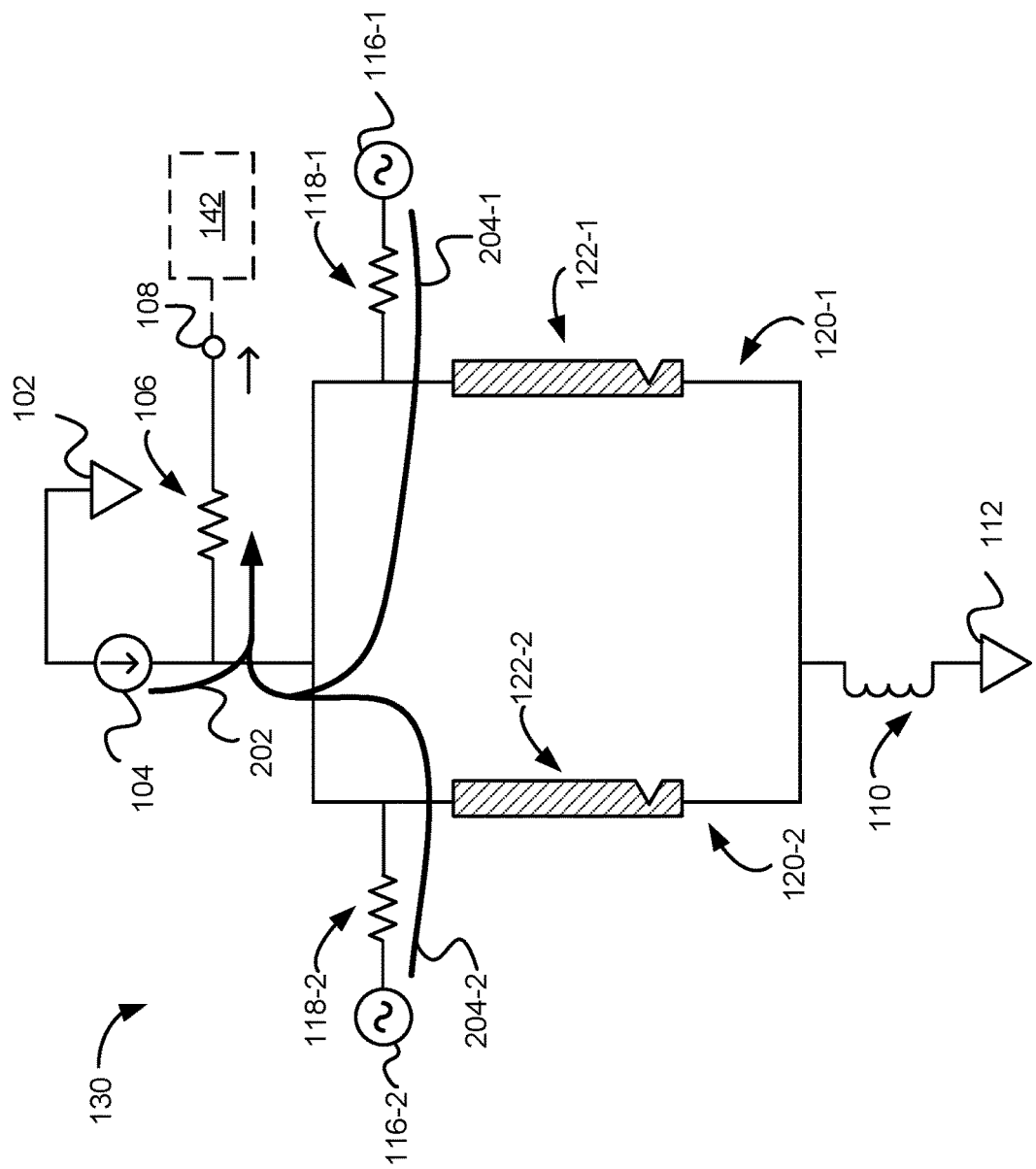

FIG. 2D shows a current 204-2 supplied by the current source 116-2 to the parallel circuit 120-2. In accordance with some embodiments, the combination of the current 204-2 and the current 202 flowing to the superconducting wire 122-2 exceeds a superconducting current threshold for the superconducting wire 122-2. Accordingly, FIG. 2E shows a resulting transition of the superconducting wire 122-2 to a non-superconducting state (denoted by the hash marks). FIG. 2E also shows currents 202, 204-1, and 204-2 flowing through the resistor 106 to the output node 108. Thus FIGS. 2A-2E illustrate a logical AND mode of operation for the circuit 130.

FIGS. 3A-3E are prophetic diagrams illustrating a representative operating sequence of the superconducting circuit 130 of FIG. 1B in a second mode of operation (e.g., a logical OR mode of operation) in accordance with some embodiments. As one of skill in the art would recognize after reading the instant disclosure, the operating principles depicted in FIGS. 3A-3E also apply to the circuit 100 in FIG. 1A and the circuit 140 in FIG. 1C.

Figure 3A:
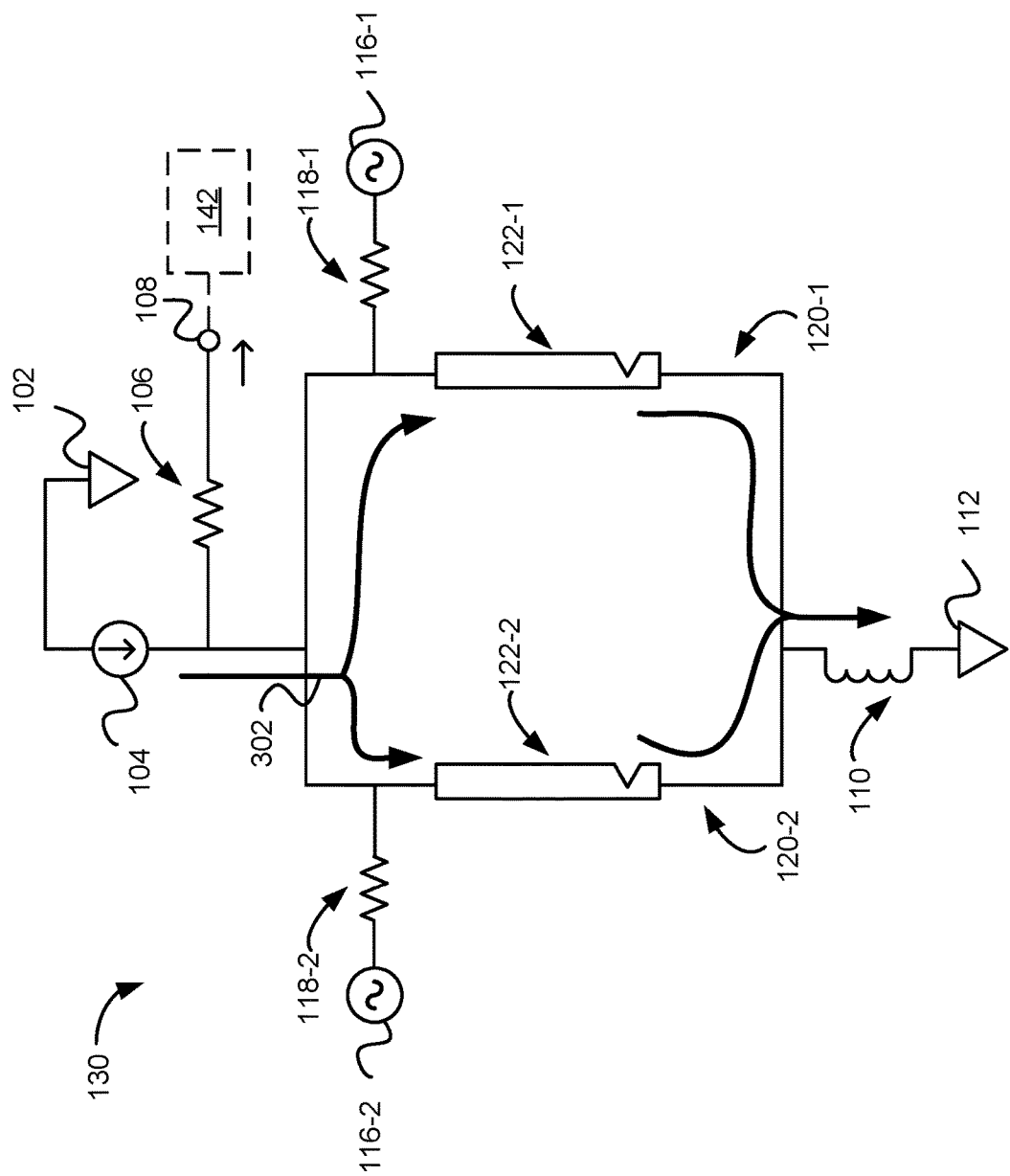
FIGS. 3A-3E are prophetic diagrams illustrating a representative operating sequence of the superconducting circuit of FIG. 1B in a second mode of operation in accordance with some embodiments.

FIG. 3A shows a current 302 (e.g., a larger current than current 202) flowing from the current source 104 through the parallel circuits 120 and the inductor 110 to the ground 112. In some embodiments, the current 302 is configured such that each superconducting wire 122 operates in a superconducting state (e.g., having zero resistance). In some embodiments, the current 302 is below a threshold superconducting current of each superconducting wire 122. In some embodiments, the current 302 is below, but closer to the threshold superconducting current than the current 202. As shown in FIG. 3A, a portion of the current 302 flows through each superconducting wire 122 and negligible current flows to the output node 108 (e.g., current below a threshold amount of output current).

Figure 3B:
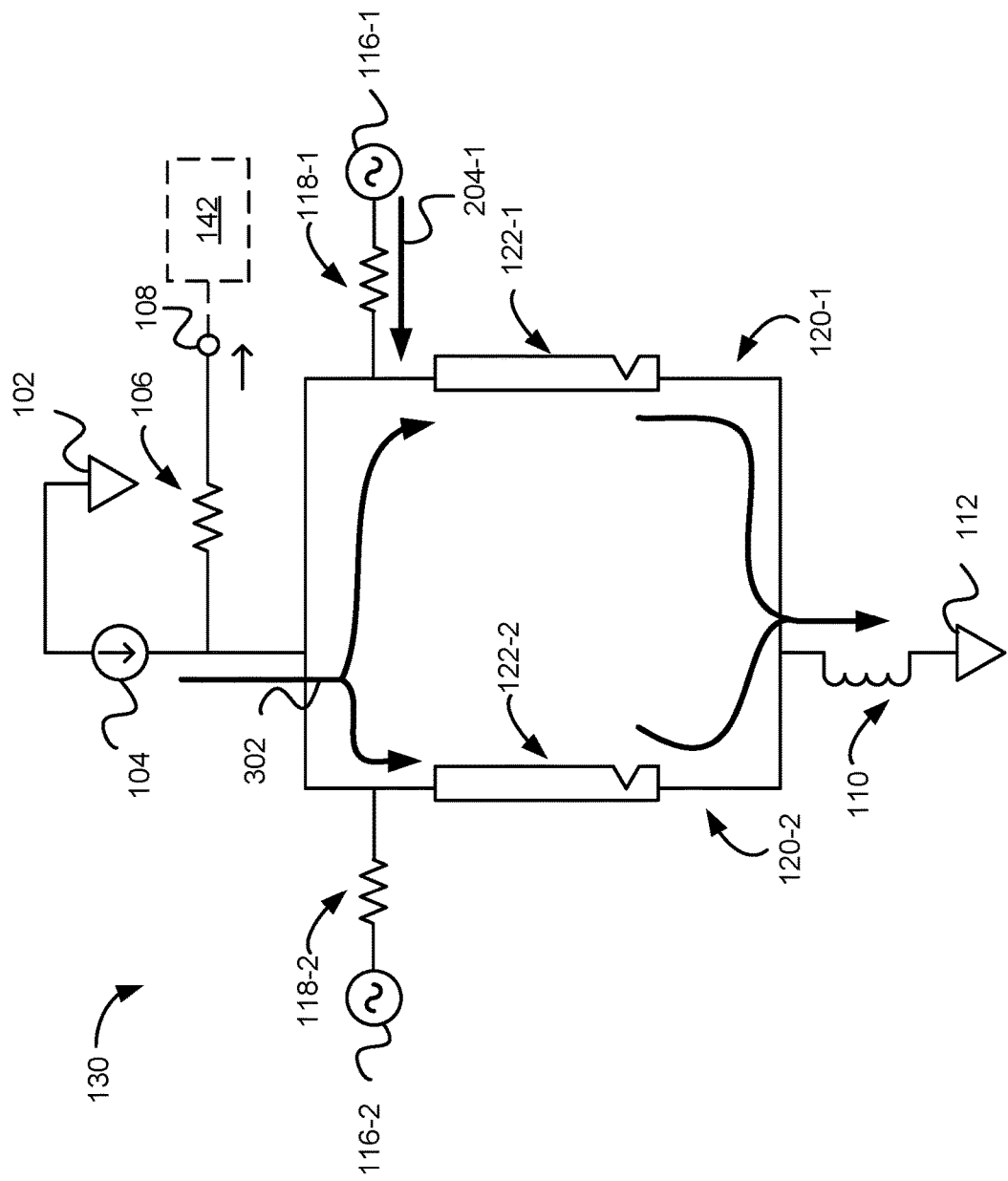
Figure 3C:
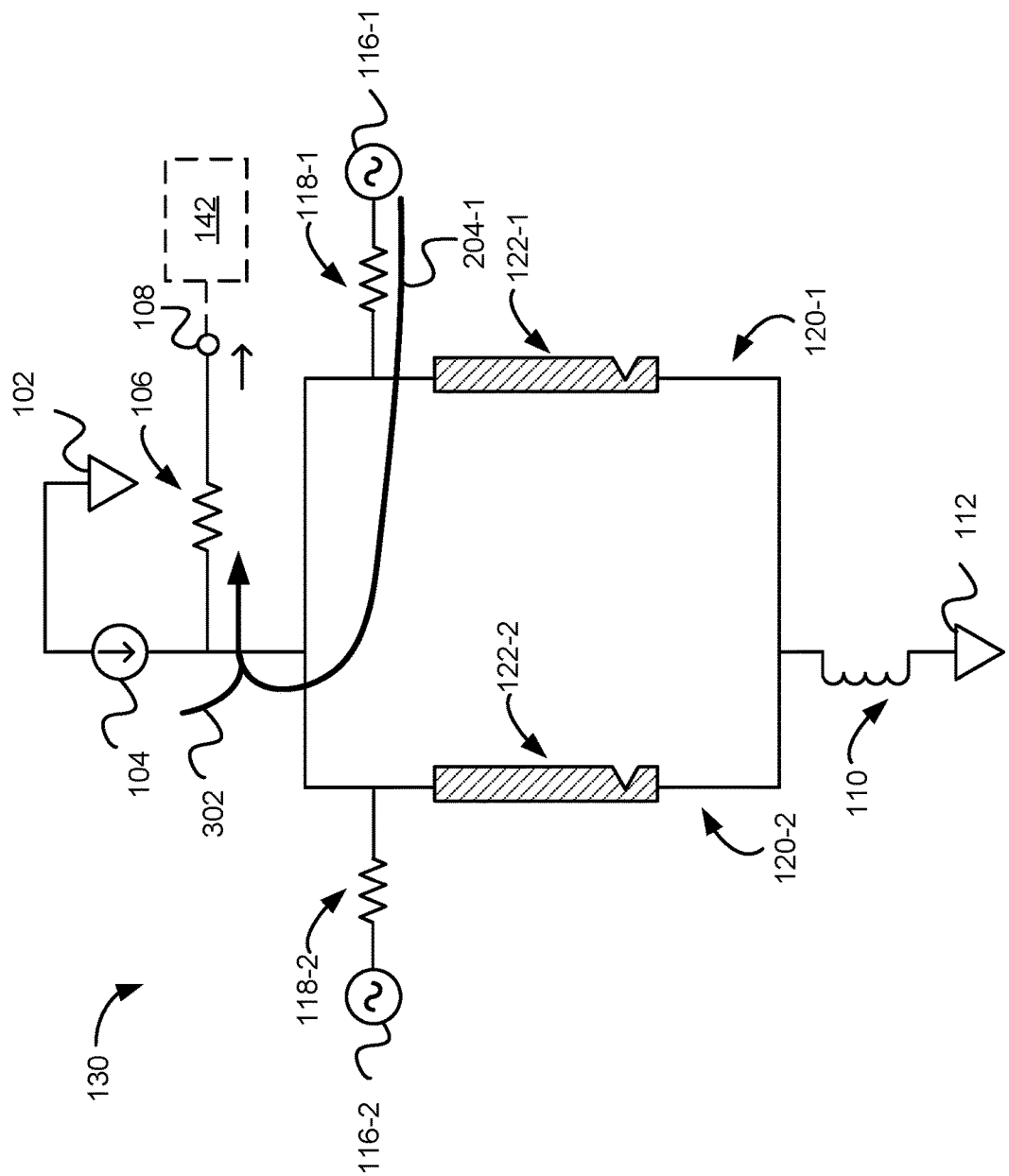

FIG. 3B shows the current 204-1 supplied by the current source 116-1 to the parallel circuit 120-1. In accordance with some embodiments, the combination of the current 204-1 and the portion of the current 302 flowing to the superconducting wire 122-1 exceeds a superconducting current threshold for the superconducting wire 122-1. In accordance with some embodiments, the combination of the current 204-1 and the current 302 causes a cascade effect that transitions each superconducting wire 122 to a non-superconducting state. Accordingly, FIG. 3C shows a resulting transition of the superconducting wires 122 to a non-superconducting state (denoted by the hash marks). FIG. 3C also shows currents 302 and 204-1 flowing through the resistor 106 to the output node 108.

Figure 3D:
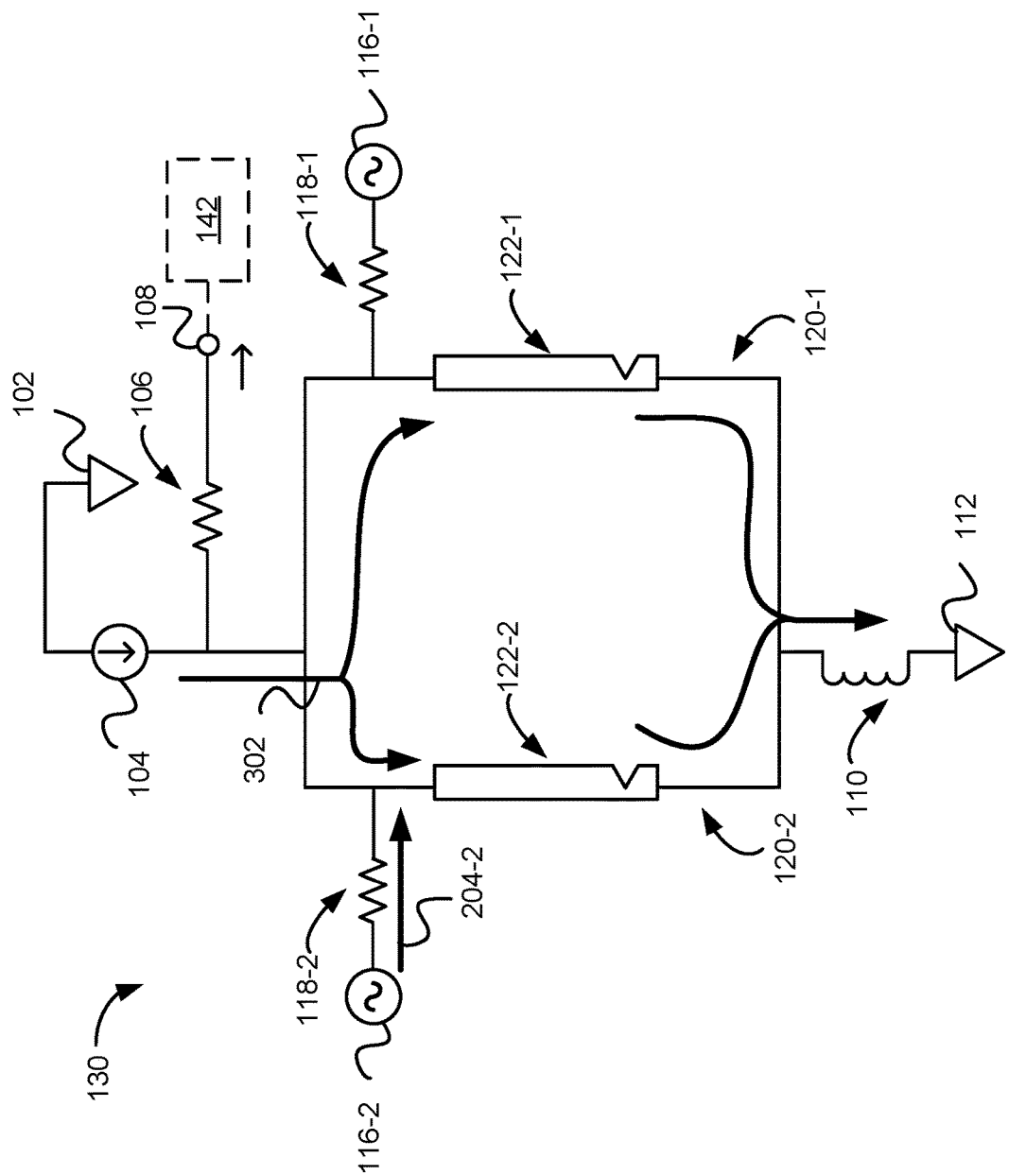
Figure 3E:
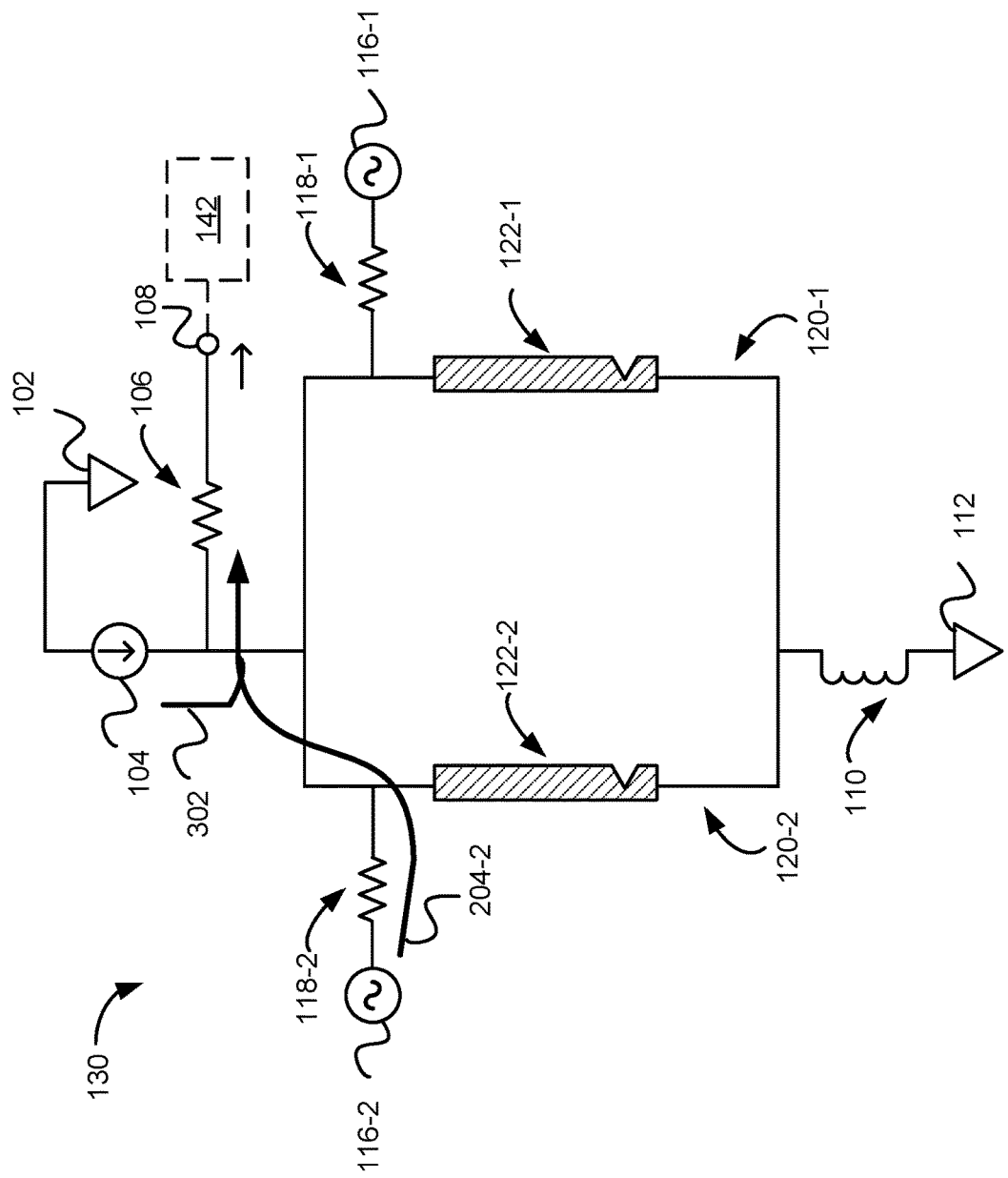

FIG. 3D shows the current 204-2 supplied by the current source 116-2 to the parallel circuit 120-2. In accordance with some embodiments, the combination of the current 204-2 and the portion of the current 302 flowing to the superconducting wire 122-2 exceeds a superconducting current threshold for the superconducting wire 122-2. In accordance with some embodiments, the combination of the current 204-2 and the current 302 causes a cascade effect that transitions each superconducting wire 122 to a non-superconducting state. Accordingly, FIG. 3E shows a resulting transition of the superconducting wires 122 to a non-superconducting state (denoted by the hash marks). FIG. 3E also shows currents 302 and 204-2 flowing through the resistor 106 to the output node 108. Thus FIGS. 3A-3E illustrate a logical OR mode of operation for the circuit 130.

Therefore, in accordance with some embodiments, an electric circuit (e.g., the circuit 130) includes: (1) a plurality of superconducting components (e.g., the superconducting wires 122); (2) a plurality of circuits coupled in parallel with one another (e.g., the parallel circuits 120), each circuit of the plurality of circuits including a respective superconducting component of the plurality of superconducting components; (3) a plurality of current sources (e.g., the current sources 116), each current source of the plurality of current sources coupled to a corresponding superconducting component of the plurality of superconducting components and configured to selectively provide a first current; (4) a first current source coupled to the plurality of circuits (e.g., the current source 104), the first current source configured to selectively provide: (a) a second current adapted to bias the plurality of superconducting components such that a combination of the second current and the first current from any current source of the plurality of current sources causes the plurality of superconducting components to transition from a superconducting state to a non-superconducting state (e.g., as illustrated in FIGS. 3A-3E); and (b) a third current adapted to bias the plurality of superconducting components such that a combination of the third current and the first current from each current source of the plurality of current sources causes the plurality of superconducting components to transition from a superconducting state to a non-superconducting state (e.g., as illustrated in FIGS. 2A-2E); and (5) an output node adapted to output a respective current while the plurality of superconducting components are in the non-superconducting state (e.g., output node 108). The electric circuit functions as a logical OR gate while the first current source provides the second current, e.g., if at least one of the inputs 116 is high (e.g., is supplied by a current representing a digital one value) then the output is high. Additionally, the electric circuit functions as a logical AND gate while the first current source provides the third current, e.g., only if all of the inputs 116 are high (e.g., are supplied by currents representing a digital one value) is the output high.

In some embodiments, the second current is in the range of 1 microamp to 20 microamps per superconducting component. In some embodiments, the third current is in the range of 1 microamp to 20 microamps per superconducting component. In some embodiments, each first current is in the range of 1 microamp to 20 microamps. While, in some embodiments, the range for the second current and the range for the third current are the same, or overlap, it is noted that, typically, the third current is smaller than the second current. Using the second current to bias circuit 120 causes it to function as an OR gate, while using the third current to bias circuit 120 causes it to function as an AND gate.

In some embodiments, the respective first current for each current source is distinct. In some embodiments, the respective superconducting current threshold differs for the superconducting components, e.g., different superconducting components have different physical dimensions resulting in different superconducting current thresholds. In some embodiments, the first current supplied to each current source is based on the respective superconducting current threshold for the corresponding superconducting component.

In some embodiments: (1) the first current source is coupled to a first end of the plurality of superconducting components; and (2) the circuit further includes an inductor coupled to a second end of the plurality of superconducting components (e.g., the inductor 110), the inductor configured to delay (e.g., slow down) a current redistribution through the plurality of superconducting components. In some embodiments, the inductor has an inductance in the range of 1 nanohenry to 1 microhenry.

In some embodiments, the first current source is coupled to a first end of the plurality of superconducting components; and the output node is coupled via a resistor (e.g., the resistor 106) to the first end of the plurality of superconducting components. In some embodiments, the resistor has a resistance in the range of 1 kiloohm to 10 megaohms.

In some embodiments, each current source of the plurality of current sources is coupled to a corresponding superconducting component of the plurality of superconducting components via a respective resistor of a plurality of resistors (e.g., the resistors 118). In some embodiments, each resistor of the plurality of resistors has a resistance in the range of 1 kiloohm to 10 megaohms. In some embodiments, at least a portion of a current provided by the first current source flows through the corresponding superconducting component without flowing through the respective resistor of the plurality of resistors at least while the corresponding superconducting component is in a superconducting state. In some embodiments, the resistors 118 are configured such that each individual resistance of the resistors 118 is greater than a resistance of the resistor 106.

In some embodiments, each superconducting component of the plurality of superconducting components is a superconducting wire. In some embodiments, each superconducting wire is a thin-film wire. In some embodiments, each wire has a width in the range of 50 nanometers to 200 nanometers. In some embodiments, each wire has a length in the range of 100 nanometers to 500 nanometers. In some embodiments, each wire has a same width, while in other embodiments the wires have two or more distinct widths. In some embodiments, each wire has a same length, while in other embodiments the wires have two or more distinct lengths.

In some embodiments, each superconducting wire includes a constricted portion (e.g., a constriction 124, as shown in FIGS. 1B and 1C). In some embodiments, each constricted portion is in the range of 10%-80% of the width of the corresponding wire. In some embodiments, each constricted portion has a same width, while in other embodiments the constricted portions include two or more distinct widths. In some embodiments, each constricted portion has a same shape (e.g., a geometric or irregular shape).

In some embodiments, the second current is adapted such that the first current provided by any (e.g., single) current source of the plurality of current sources, combined with the second current, causes an avalanche effect, where each superconducting component of the plurality of superconducting components transitions from the superconducting state to the non-superconducting state, e.g., as illustrated in FIGS. 3B-3C and 3D-3E.

In some embodiments, while the first current source is providing the second current, providing the first current at any one of the plurality of current sources causes the plurality of superconducting components to transition from the superconducting state to the non-superconducting state, e.g., as illustrated in FIGS. 3B-3C and 3D-3E. In some embodiments, after the plurality of superconducting components transitions to the non-superconducting state, at least a portion of the first and second currents (e.g., at least a portion of a sum of the first current and the second current) is provided at the output node (e.g., as shown in FIG. 3E).

In some embodiments, while the first current source is providing the third current, providing the first current at each current source of the plurality of current sources causes the plurality of superconducting components to transition from the superconducting state to the non-superconducting state, e.g., as illustrated in FIGS. 2D-2E.

In some embodiments, while the first current source is providing the second current, concurrently providing the first current at each current source of the plurality of current sources causes the plurality of superconducting components to transition from the superconducting state to the non-superconducting state.

In some embodiments, while the first current source is providing the third current, providing the first current at one or more current sources, less than all, of the plurality of current sources forgoes causing all superconducting components of the plurality of superconducting components to transition from the superconducting state to the non-superconducting state, e.g., as illustrated in FIGS. 2B-2C.

In some embodiments, after all superconducting components of the plurality of superconducting components transition to the non-superconducting state, a first output current (that corresponds to at least a portion of the first and second currents) is provided at the output node (e.g., the first output current is higher than a current threshold corresponding to a logical 1 output). In some embodiments, while at least one superconducting component of the plurality of superconducting components remains in the superconducting state, a second output current that is less than the first output current is provided at the output node (e.g., the second output current is lower than a current threshold corresponding to a logical 1 output).

In some embodiments, the electric circuit further includes a readout circuit coupled to the output node. In some embodiments, the readout circuit includes one or more superconductor and/or semiconductor components. In some embodiments, the readout circuit (e.g., readout circuit 142, FIG. 1A) is configured to transition to a state that indicates whether circuit 130's output on node 108 is a first logical level, such as a logical 0 (e.g., output current less than a predefined threshold), or a second logical level, such as a logical 1 (e.g., output current larger than the predefined threshold), and thereby facilitates providing the logical state of circuit 130 to other circuits or system components. For example, in some embodiments, the readout circuit (e.g., readout circuit 142, FIG. 1A) is configured to transition to a state that indicates whether the output of circuit 130 is a first logical level (e.g., a logical 0) or a second logical level (e.g., a logical 1) based on the output current on node 108. In some embodiments, the readout circuit (e.g., readout circuit 142, FIG. 1A) is configured to measure current received on node 108 or a voltage corresponding to the current on node 108. In some embodiments, the readout circuit (e.g., readout circuit 142, FIG. 1A) is a voltage readout circuit. In some embodiments, the readout circuit (e.g., readout circuit 142, FIG. 1A) includes a resistor (e.g., 50 ohms) and the readout circuit is configured to measure a voltage drop, over the resistor, based on application of the current received on node 108 to the resistor. In some embodiments, the readout circuit has a resistance less than a resistance of the plurality of circuits while the superconducting components are operating in the non-superconducting state.

Figure 4:
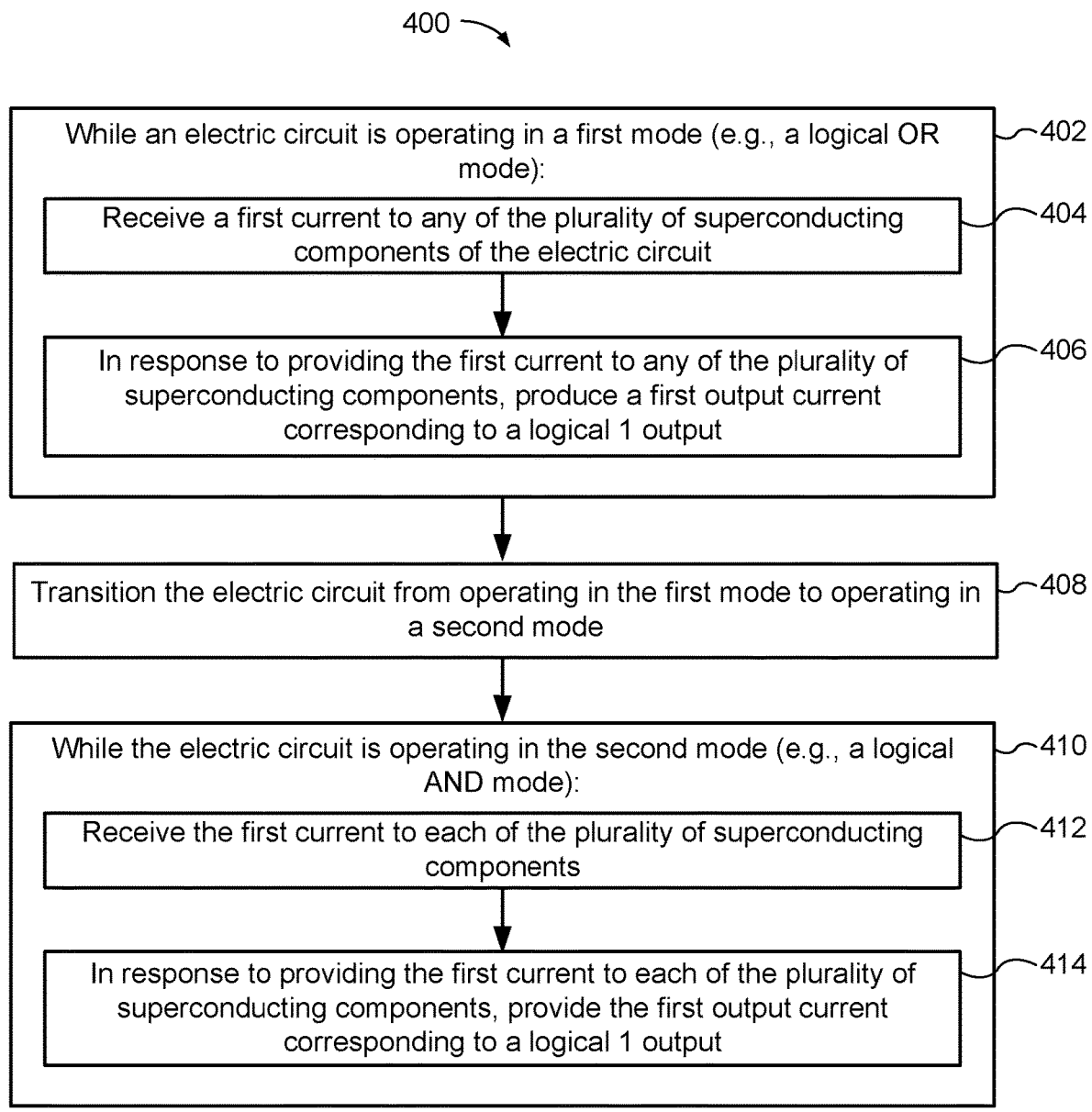
FIG. 4 is a flow diagram illustrating a representative method of operating a superconducting circuit in accordance with some embodiments.

FIG. 4 is a flow diagram illustrating a method 400 of operating an electric circuit in accordance with some embodiments. In some embodiments, the method 400 is performed at an electric circuit (e.g., the circuit 130) having a plurality of circuits coupled in parallel with one another (e.g., the parallel circuits 120), each circuit of the plurality of circuits including a respective superconducting component of a plurality of superconducting components (e.g., the superconducting wires 122).

While an electric circuit is operating in a first mode (402): (a) a first current (404) is received at any of the plurality of superconducting components (e.g., current 204-1 or current 204-2); and (b) in response to receiving the current at any of the plurality of superconducting components, a first output current (406) is produced (e.g., the output current at the output node 108).

The electric circuit is transitioned (408) from operating in the first mode to operating in the second mode. In some embodiments, the electric circuit is transitioned from the first mode to the second mode by adjusting a bias current supplied to the electric circuit.

While the electric circuit is operating in a second mode (410): (a) the first current is received (412) at each of the plurality of superconducting components (e.g., as illustrated in FIG. 2D); and (b) in response to receiving the first current at each of the plurality of superconducting components, the first output current (414) is produced (e.g., as illustrated in FIG. 2E).

In some embodiments, while in the first mode, in response to the first current, the plurality of superconducting components transitions from the superconducting state to the non-superconducting state (e.g., as illustrated in FIGS. 3B-3C and 3D-3E).

In some embodiments, while in the second mode, in response to receiving the first current at less than all of the superconducting components, the remaining superconducting components of the plurality of superconducting components continue to operate in the superconducting state (e.g., as illustrated in FIG. 2C). In some embodiments, while in the second mode, in response to receiving the first current at all of the superconducting components, the plurality of superconducting components transitions from the superconducting state to the non-superconducting state (e.g., as illustrated in FIG. 2E).

In some embodiments, the electric circuit functions as a logical OR gate while operating in the first mode and functions as a logical AND gate while operating in the second mode.

In some embodiments, receiving a second current (e.g., the current 302) at the plurality of superconducting components causes the electric circuit to operate in the first mode; and receiving a third current (e.g., the current 202) that is distinct from the second current at the plurality of superconducting components causes the electric circuit to operate in the second mode. In some embodiments, the second current is greater than the third current.

In some embodiments, the combination of the first current and the second current causes an avalanche effect for the plurality of superconducting components, e.g., as illustrated in FIGS. 3B-3C. In some embodiments, the combination of the first current and the third current does not cause an avalanche effect, e.g., as illustrated in FIGS. 2A-2E.

In accordance with some embodiments, an electric circuit (e.g., circuit 130) includes: (1) a plurality of superconducting components (e.g., the superconducting wires 122); (2) a plurality of circuits coupled in parallel with one another (e.g., the parallel circuits 120), each circuit of the plurality of circuits including a respective superconducting component of the plurality of superconducting components; and (3) a plurality of current sources coupled to the plurality of superconducting components (e.g., the current sources 116), each current source of the plurality of current sources coupled to a corresponding superconducting component of the plurality of the superconducting components.

In some embodiments, the electric circuit is configured to: (1) operate in a first mode (e.g., a logical OR mode), including providing an output current in response to receiving a first current at any of the plurality of current sources; and (2) operate in a second mode (e.g., a logical AND mode), including providing an output current only in response to receiving the first current at each of the plurality of current sources.

In some embodiments, while operating in the first mode, providing the first current at any of the plurality of current sources causes the plurality of superconducting components to transition from a superconducting state to a non-superconducting state, e.g., as illustrated in FIGS. 3B-3C and 3D-3E.

In some embodiments, while operating in the second mode, concurrently providing the first current at each current source of the plurality of current sources causes the plurality of superconducting components to transition from a superconducting state to a non-superconducting state, e.g., as illustrated in FIGS. 2D-2E.

In some embodiments, while operating in the first mode, concurrently providing the first current at each current source of the plurality of current sources causes the plurality of superconducting components to transition from a superconducting state to a non-superconducting state, e.g., the circuit is configured to operate as a logical OR gate rather than a logical XOR gate.

In some embodiments, while operating in the second mode, providing the first current at one or more current sources, less than all, of the plurality of current sources forgoes causing all superconducting components of the plurality of superconducting components to transition from a superconducting state to a non-superconducting state, e.g., as illustrated in FIGS. 2B-2C.

In accordance with some embodiments, an electric circuit includes: (1) a plurality of superconducting components (e.g., superconducting wires 122, FIG. 1B), each superconducting component of the plurality of superconducting components having a first terminal and a second terminal; (2) a plurality of current sources (e.g., current sources 116, FIG. 1B), each current source of the plurality of current sources coupled to the first terminal (e.g., the terminal 123) of a corresponding superconducting component of the plurality of superconducting components and configured to selectively provide a first current; (3) a first current source (e.g., current source 104, FIG. 1B) coupled to the respective first terminal of each of the plurality of superconducting components, the first current source configured to selectively provide: (a) a second current adapted to bias the plurality of superconducting components such that a combination of the second current and the first current from any current source of the plurality of current sources causes the plurality of superconducting components to transition from a superconducting state to a non-superconducting state (e.g., as illustrated in FIGS. 3A-3C); and (b) a third current adapted to bias the plurality of superconducting components such that (i) a combination of the third current and the first current from each current source of the plurality of current sources causes the plurality of superconducting components to transition from the superconducting state to the non-superconducting state, and (ii) a combination of the third current and the first current from each current source of only a subset of the plurality of current sources does not cause the plurality of superconducting components to transition to the non-superconducting state (e.g., as illustrated in FIGS. 2A-2E); and (4) an output node (e.g., output node 108, FIG. 1B) adapted to output a respective current while the plurality of superconducting components is in the non-superconducting state. In some embodiments, the electric circuit is configured to perform any of the methods described herein.

In some embodiments, the circuit further includes a reference node (e.g., electrical ground 112, FIG. 1B) coupled to the second terminal (e.g., the terminal 125) of each of the plurality of superconducting components.

In some embodiments, the circuit further includes a plurality of circuits coupled in parallel (e.g., circuits 120, FIG. 1B), each circuit of the plurality of circuits including a respective superconducting component of the plurality of superconducting components.

In some embodiments: (1) each superconducting component of the plurality of superconducting components has a main channel that separates the first terminal from the second terminal; and (2) the first terminal of each superconducting component is at a first end of the main channel and the second terminal of each superconducting component is at a second end of the main channel, opposite from the first end.

In accordance with some embodiments, an electric circuit includes: (1) a plurality of superconducting components (e.g., superconducting wires 122, FIG. 1B), each superconducting component of the plurality of superconducting components having a shared channel (e.g., between the terminals 123 and 125 in FIG. 1B); (2) a plurality of current sources (e.g., current sources 116, FIG. 1B), each current source of the plurality of current sources configured to selectively provide a first current and coupled to a corresponding superconducting component of the plurality of superconducting components such that the first current flows through the shared channel of the corresponding superconducting component while the corresponding superconducting component is in a superconducting state; (3) a first current source (e.g., current source 104, FIG. 1B) configured to selectively provide a second current and a third current and coupled to each of the plurality of superconducting components such that the second current and the third current flow through the main channel of respective superconducting components of the plurality of superconducting components while the respective superconducting components are in the superconducting state; where: (a) the second current is adapted to bias the plurality of superconducting components such that a combination of the second current and the first current from any current source of the plurality of current sources exceeds a respective transition current (e.g., corresponding to a superconducting current threshold) for the main channel of each of the plurality of superconducting components, thereby causing the plurality of superconducting components to transition from a superconducting state to a non-superconducting state (e.g., as illustrated in FIGS. 3A-3C); and (b) the third current is adapted to bias the plurality of superconducting components such that (i) a combination of the third current and the first current from each current source of the plurality of current sources exceeds the respective transition current for the main channel of each of the plurality of superconducting components, thereby causing the plurality of superconducting components to transition from the superconducting state to the non-superconducting state, and (ii) a combination of the third current and the first current from each current source of only a subset of the plurality of current sources does not exceed the respective transition current for the main channel of each of the plurality of superconducting components (e.g., as illustrated in FIGS. 2A-2E); and (4) an output node (e.g., output node 108, FIG. 1B) adapted to output a respective current while the plurality of superconducting components is in the non-superconducting state. In some embodiments, the electric circuit is configured to perform any of the methods described herein.

In some embodiments, for each superconducting component of the plurality of superconducting components, the transition from the superconducting state to the non-superconducting state is triggered by current through the main channel exceeding the respective transition current.

In some embodiments, the respective transition current for a particular superconducting component of the plurality of superconducting components corresponds to a threshold current density for at least a portion of the main channel of the particular superconducting component.

In accordance with some embodiments, an electric circuit includes: (1) a plurality of superconducting components (e.g., superconducting wires 122, FIG. 1C), the plurality of superconducting components including at least three superconducting components; (2) a plurality of current sources (e.g., current sources 116, FIG. 1C), each current source of the plurality of current sources coupled to a corresponding superconducting component of the plurality of superconducting components and configured to selectively provide a first current; (3) a first current source (e.g., current source 104, FIG. 1C) coupled to each of the plurality of superconducting components, the first current source configured to selectively provide: (a) a second current adapted to bias the plurality of superconducting components such that a combination of the second current and the first current from any current source of the plurality of current sources causes the plurality of superconducting components to transition from a superconducting state to a non-superconducting state (e.g., as illustrated in FIGS. 3A-3C); and (b) a third current adapted to bias the plurality of superconducting components such that (i) a combination of the third current and the first current from each of a subset of the plurality of current sources causes the plurality of superconducting components to transition from the superconducting state to the non-superconducting state, and (ii) a combination of the third current and the first current from each of less than the subset of the plurality of current sources does not cause the plurality of superconducting components to transition to the non-superconducting state, wherein the subset of the plurality of current sources includes at least two current sources; and (c) a fourth current adapted to bias the plurality of superconducting components such that (i) a combination of the fourth current and the first current from each current source of the plurality of current sources causes the plurality of superconducting components to transition from the superconducting state to the non-superconducting state, and (ii) a combination of the fourth current and the first current from less than each of the plurality of current sources does not cause the plurality of superconducting components to transition to the non-superconducting state (e.g., as illustrated in FIGS. 2A-2E); and (4) an output node (e.g., output node 108, FIG. 1C) adapted to output a respective current while the plurality of superconducting components is in the non-superconducting state.

In some embodiments, the electric circuit functions as a logical OR gate while the first current source provides the second current; functions as a logical majority gate while the first current source provides the third current; and functions as a logical AND gate while the first current source provides the fourth current. In some embodiments, the subset of the plurality of current sources includes at least two current sources, or alternatively a majority of the current sources, but less than all of the current sources in the plurality of current sources. In some embodiments, the electric circuit is configured to perform any of the methods described herein.

Heat Input Embodiments

In some embodiments, a heat source is utilized to trigger a transition of a superconducting wire, e.g., rather than a current source such as current sources 116 described above.

Figure 5:
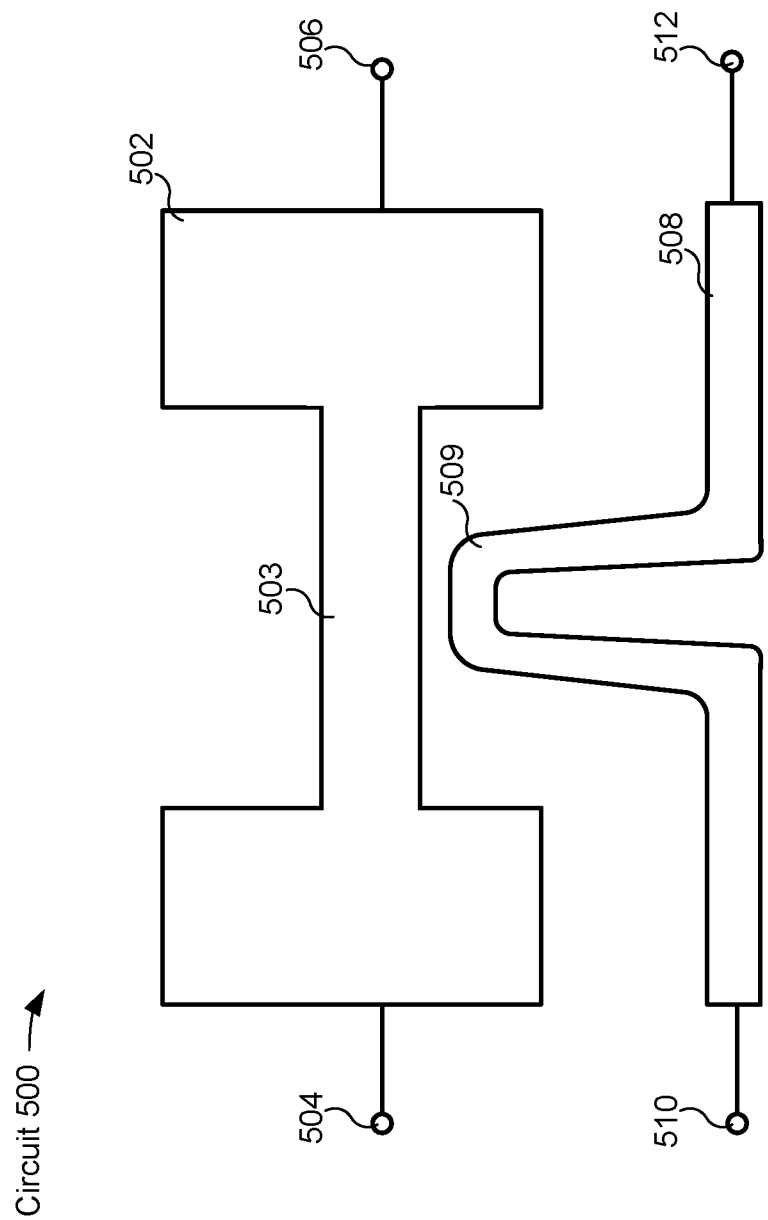
FIG. 5 is a schematic diagram illustrating a representative superconducting circuit in accordance with some embodiments.

Accordingly, FIG. 5 shows a heat transfer circuit 500 in accordance with some embodiments. FIG. 5 shows the circuit 500 having a superconducting component 502 and a heat source 508, e.g., another superconducting component. FIG. 5 further shows terminals 504 and 506 connected to the superconducting component 502 and terminals 510 and 512 connected to the heat source 508. The superconducting component 502 includes a narrow portion 503 adjacent to a region 509 of the heat source 508, which thermally-couples the superconducting component 502 and heat source 508. In some embodiments, the superconducting component 502 and heat source 508 are thermally-coupled and electrically-insulated or isolated. In some embodiments, the superconducting component 502 and the heat source 508 are positioned so as to allow heat transfer between the components 502 and 508 but inhibit or prevent electrons from transferring (e.g., via tunneling or Cooper pairs).

In some embodiments, heat source 508 is a superconductor, while in some other embodiments, heat source 508 is a non-superconducting component, e.g., a resistive component formed from a metal material, a semiconducting material or any other resistive material. In some embodiments, heat source 508 comprises a metal and/or doped semiconductor. In embodiments in which the heat source 508 is a metal or doped semiconductor, some heat is generated through region 509 of the heat source 508 as current flows between terminals 510 and 512.

As noted above, in some embodiments, the heat source 508 is a superconductor. In accordance with some embodiments, transition, and operation, of a superconducting heat source 508 in a non-superconducting state generates heat. In some embodiments, the heat source 508 is a superconductor and is configured to have a superconducting threshold current such that a current flowing through the heat source 508 in excess of the superconducting threshold current transitions the heat source 508 from the superconducting state to the non-superconducting state. In some embodiments, at least a portion of the heat generated by the heat source 508 transfers to the narrow portion 503 of the superconducting component 502. In accordance with some embodiments, the transferred heat is sufficient to trigger a transition of the narrow portion 503 to from the superconducting state to the non-superconducting state.

In some embodiments, the heat source 508 is a metal and/or doped semiconductor. In embodiments in which the heat source 508 is a metal or doped semiconductor, some heat is generated through region 509 of heat source 508 as current flows between terminals 510 and 512. In some embodiments, the heat source 508 is a metal and/or doped semiconductor and is configured such that supplying current that exceeds a threshold amount generates sufficient heat to transition the superconducting component 502 from the superconducting state to the non-superconducting state. In some embodiments, the threshold amount corresponds to a thermal coupling strength between region 509 of heat source 508 and portion 503 of the superconducting component 502.

Additional details regarding operation of circuit 500 and related heat source circuits are disclosed in U.S. application Ser. No. 16/136,124, filed Sep. 19, 2018, entitled "Methods and Devices for Impedance Multiplication," which is incorporated by reference in its entirety.

Figure 6:
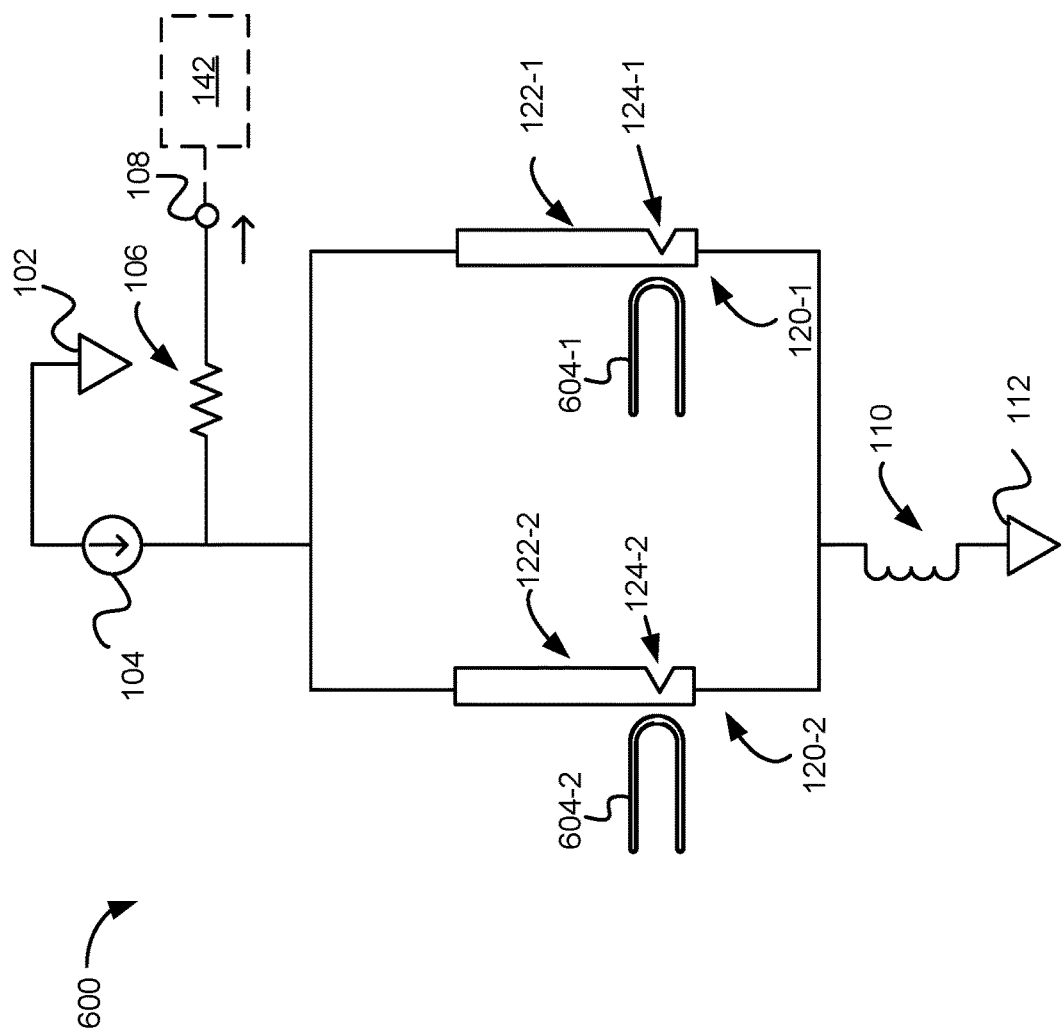
FIG. 6 is a schematic diagram illustrating a representative superconducting circuit in accordance with some embodiments.

FIG. 6 is a schematic diagram illustrating a superconducting circuit 600 in accordance with some embodiments. The circuit 600 is similar to the circuit 130 in FIG. 1B, except that the current sources 116, and associated resisters 118, in FIG. 1B have been replaced by heat sources 604 in FIG. 6. In some embodiments, a heat source 604 is, or includes, the heat source 508 described above with respect to FIG. 5. As shown in FIG. 6, a heat source 604-1 is positioned in proximity to the superconducting wire 122-1 (e.g., within 10 nm, 50 nm, or 100 nm) such that heat from the heat source 604-1 transfers to the superconducting wire 122-1 in accordance with some embodiments. Similarly, a heat source 604-2 is positioned in proximity to the superconducting wire 122-2 such that heat from the heat source 604-2 transfers to the superconducting wire 122-2 in accordance with some embodiments. In some embodiments, the heat sources 604 are arranged vertically (e.g., are above or below) with the superconducting wires 122. In some embodiments, the heat sources 604 are arranged horizontally with the superconducting wires 122 (e.g., on a same fabrication layer).

In some embodiments, the transferred heat is sufficient to transition the corresponding superconducting wire 122 to a non-superconducting state. For example, the transferred heat raises a temperature of the superconducting wire 122-1, which results in a decrease in the superconducting current threshold for the superconducting wire 122-1. In this example, a current supplied to the superconducting wire 122-1 exceeds the decreased superconducting current threshold and thus the superconducting wire 122-1 transitions to the non-superconducting state. As another example, the transferred heat raises a temperature of the superconducting wire 122-1 such that the temperature of the superconducting wire 122-1 exceeds in the superconducting temperature threshold for the superconducting wire 122-1. In this example, a temperature of the superconducting wire 122-1 exceeds the superconducting temperature threshold and thus the superconducting wire 122-1 transitions to the non-superconducting state. In some embodiments, the heat source 604-1 is in proximity to the constriction 124-1 (e.g., within 10 nm, 50 nm, or 100 nm) and the heat source 604-2 is in proximity to the constriction 124-2. As one of skill in the art will appreciate after reading the present disclosure, the operating principles described above with respect to FIGS. 2A-2E and 3A-3E also apply to the circuit 600.

Figure 7A:
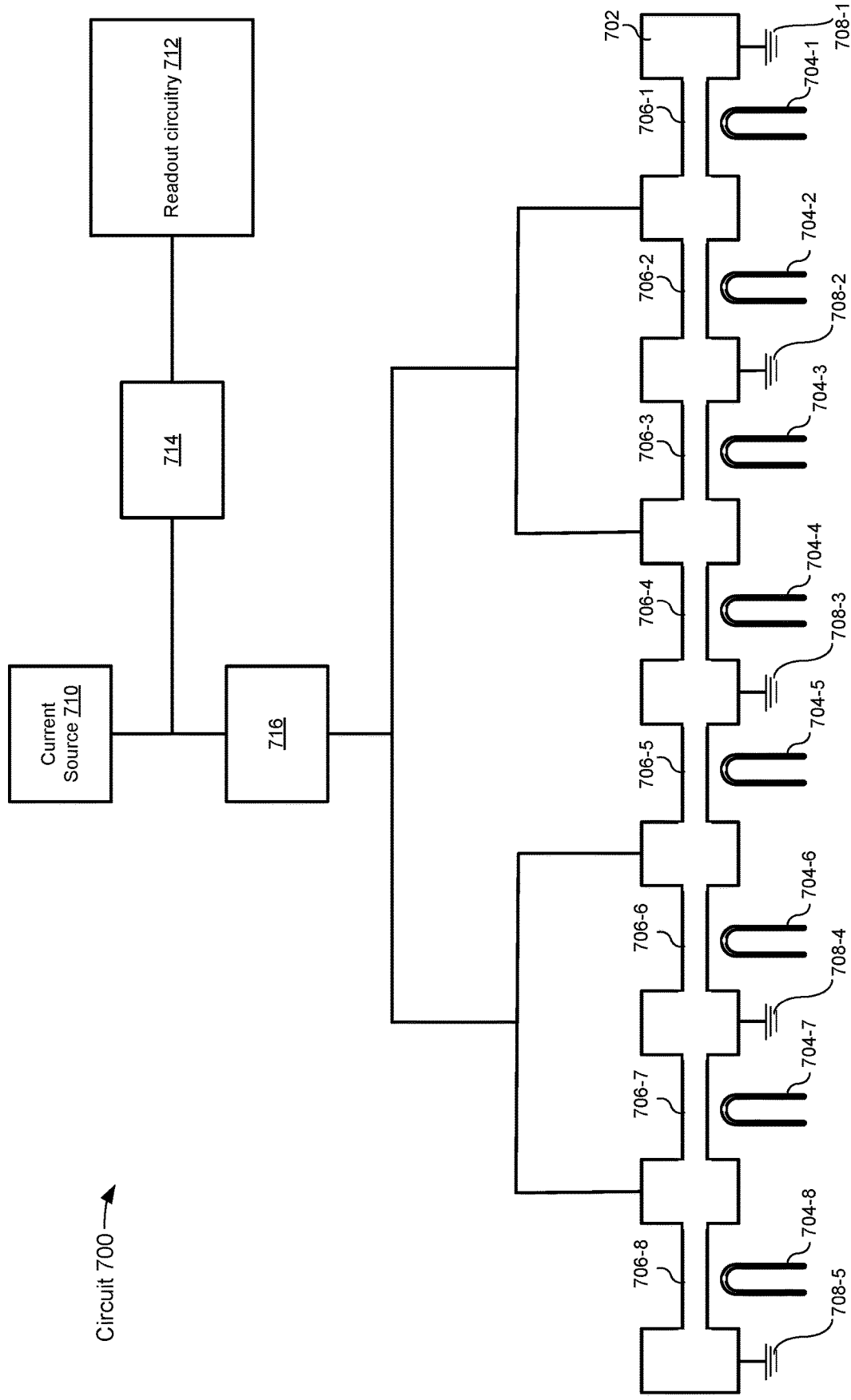
FIGS. 7A-7B are schematic diagrams illustrating representative superconducting circuits in accordance with some embodiments.
Figure 7B:
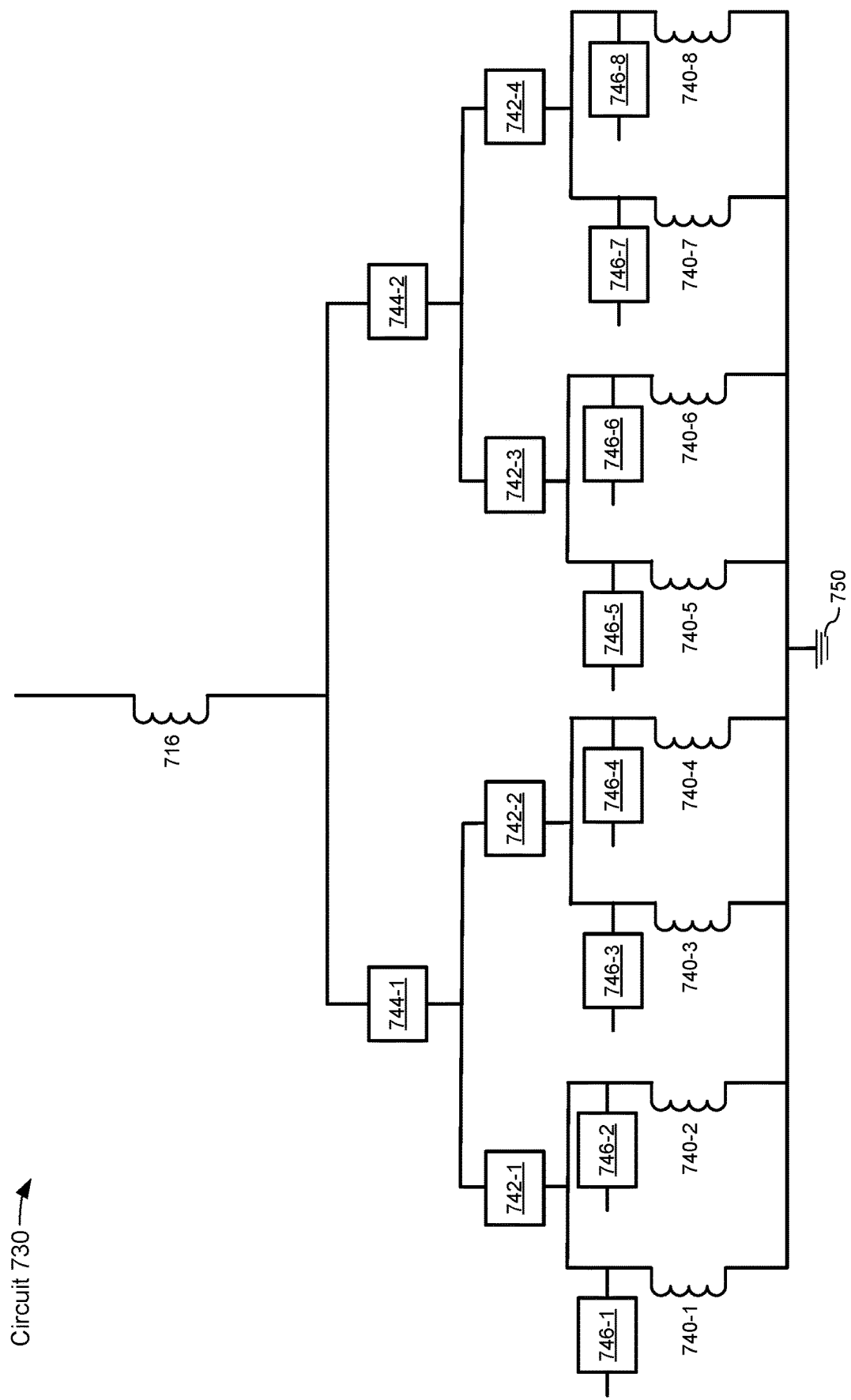

FIGS. 7A-7B are schematic diagrams illustrating representative superconducting circuits in accordance with some embodiments. FIG. 7A shows a superconducting circuit 700 having a superconducting component 702 with alternating wide and narrow portions (e.g., narrow portions 706-1 through 706-7). In some embodiments, the superconducting component 702 is a thin film of superconducting material having alternating wide and narrow portions. FIG. 7A further shows heat sources 704 thermally-coupled to the superconducting component 702. In some embodiments, the heat sources 704 are composed of superconducting materials. In some embodiments, a heat source 704 is, or includes, the heat source 508 described above with respect to FIG. 5. In some embodiments, (not shown) one or more of the heat sources 704 is replaced with a current source. In some embodiments, the circuit 700 includes one or more additional components (not shown), such as resistive, capacitive, and inductive components.

In some embodiments, the superconducting component 702 and the heat sources 704 are patterned from a single thin film of superconducting material. In some embodiments, the heat sources 704 are each thermally-coupled and electrically-insulated (e.g., electrically-isolated) from superconducting component 702. FIG. 7A further shows a current source 710 coupled to the superconducting component 702 via a component 716 (e.g., an inductor). In accordance with some embodiments, the current source 710 is coupled to alternating wide portions of the superconducting component 702. The other wide portions of the superconducting component 702 are coupled to reference nodes 708 (e.g., an electrical ground) in accordance with some embodiments. FIG. 7A also shows readout circuitry 712 coupled to the superconducting component 702 via a coupling component 714 (e.g., a capacitor, a resistor, and/or other circuit component). In some embodiments, the readout circuitry 712 is the readout circuit 142 (FIG. 1A). In some embodiments, the circuit 700 includes a plurality of circuits 500 (FIG. 5) coupled together. In some embodiments, the circuit 700 consumes less than 0.1 milliwatts per input (e.g., per heat source 704).

FIG. 7B shows an electrical circuit 730 equivalent to the diagram of FIG. 7A without the readout circuitry 712 and associated coupling component 714. In FIG. 7B, the circuit 730 includes inductors 740 representing inductances associated with the superconducting components in FIG. 7A, and optionally the component 716. The circuit 730 further includes resistances 742, 744, and 746. In some embodiments, the resistances 742, 744, and 746 are, or include, inherent resistances in the wires coupling the inductors.

Figure 8A:
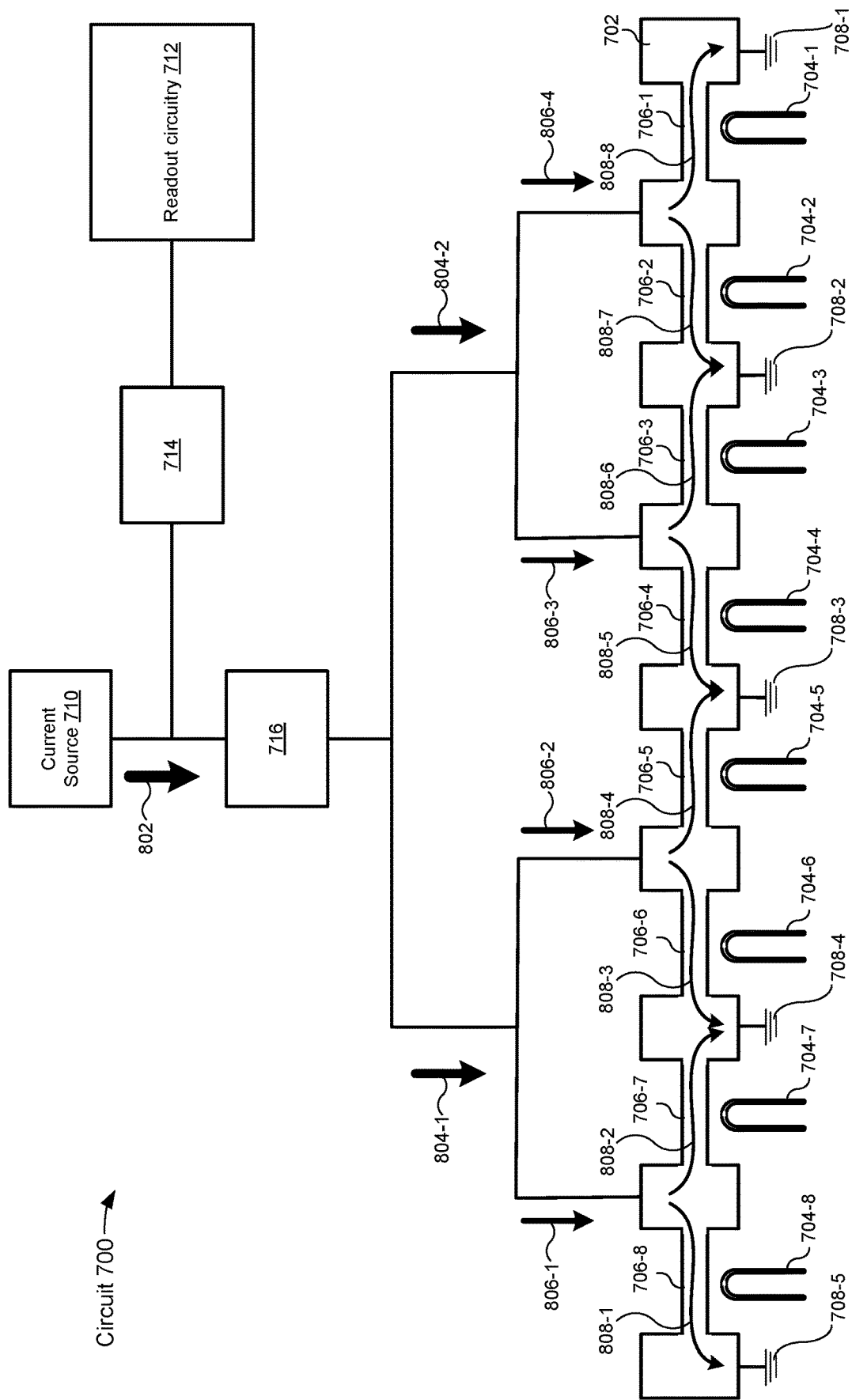
FIGS. 8A-8D are prophetic diagrams illustrating a representative operating sequence of the superconducting circuit of FIG. 7A in a first mode of operation in accordance with some embodiments.

FIGS. 8A-8D are prophetic diagrams illustrating a representative operating sequence of the superconducting circuit of FIG. 7A in a first mode of operation (e.g., a logical AND mode of operation) in accordance with some embodiments. FIG. 8A shows the circuit 700 at a first time. At the first time, the current source 710 supplies a current 802 to the superconducting component 702 via the component 716. In accordance with some embodiments, the current 802 is configured such that the superconducting component 702 is operating in a superconducting state. The current 802 splits (e.g., 50-50) to currents 804; the currents 804 split (e.g., 50-50) to corresponding currents 806; and the currents 806 split (e.g., 50-50) to currents 808. Thus, in accordance with some embodiments, each current 808 is approximately ⅛th of the current 802. In some embodiments, a resistance of the readout circuitry 712 and/or the coupling component 714 is significantly larger than a resistance through the component 716 and superconducting component 702 (when the superconducting component is in a superconducting state) and thus a large majority of the current 802 (e.g., 80%, 90%, or 99%) flows through the superconducting component 702. In this example, while any of the narrow portions of the superconducting component 702 is in the superconducting state, an amount of current 802 flowing to the readout circuitry 712 is below a predefined threshold, thereby producing a first logical value (e.g., a logical 0) output at the readout circuitry 712.

Figure 8B:
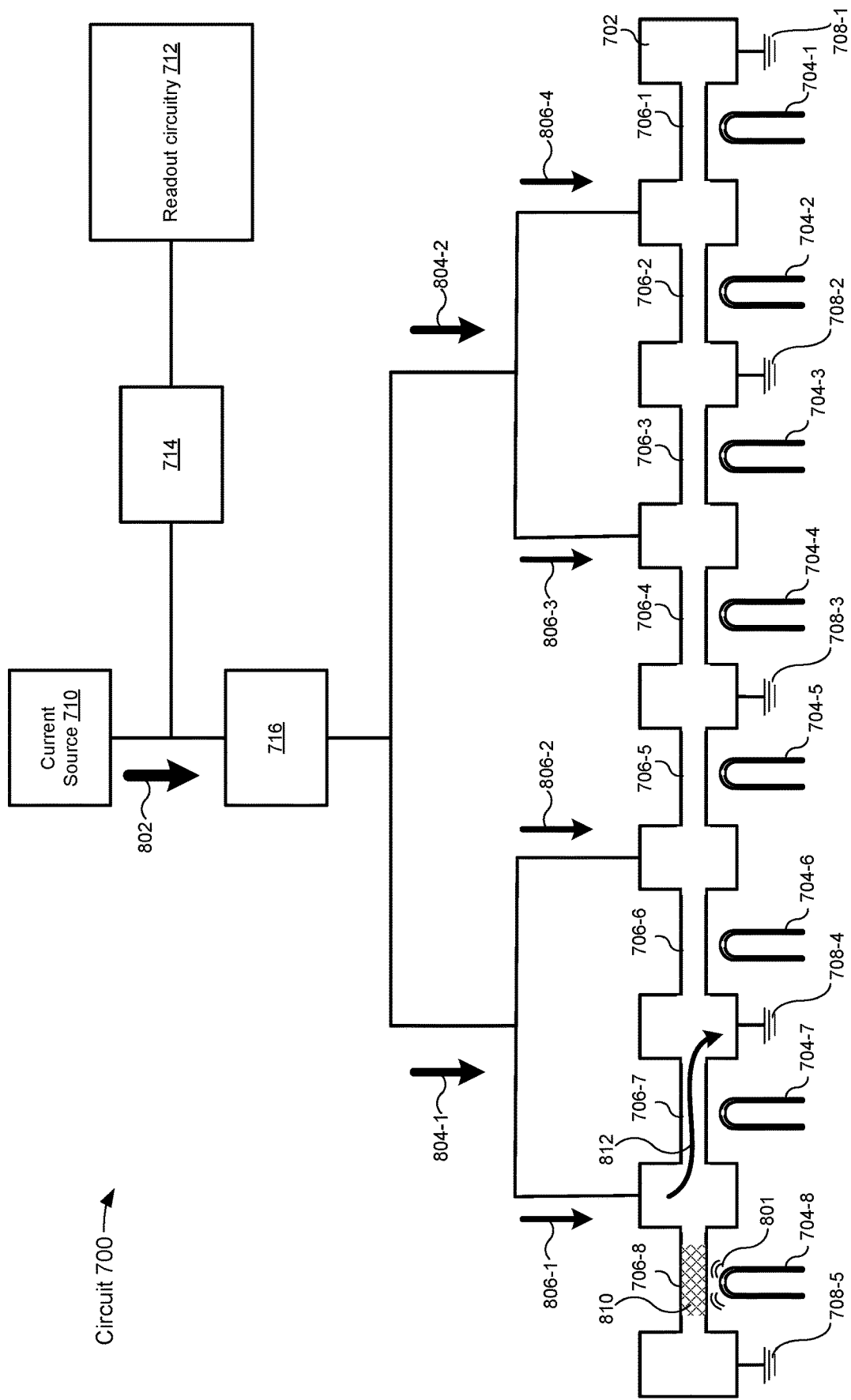

FIG. 8B shows the circuit 700 at a second time subsequent to the first time. At the second time, the heat source 704-8 is active (e.g., the heat source 704-8 is supplying heat to the narrow portion 706-8). In accordance with some embodiments, heat 801 transferring from the heat source 704-8 lowers a superconducting current threshold of the narrow portion 706-8 such that at least a portion 810 of the narrow portion 706-8 transitions to a non-superconducting state. In some embodiments, the heat source 704-8 is a superconductor that has transitioned to, and/or has remained in, the non-superconducting state and thus is generating resistive heat. The transition of the portion 810 of the narrow portion 706-8 to the non-superconducting state results in the current 808-1 (in FIG. 8A) being redirected to other portions of the superconducting component 702, as shown by increased current 812 through the narrow portion 706-7. In FIG. 8B, the narrow portion 706-7 (along with certain other narrow portions 706, such as 706-1 and 706-2) remains in a superconducting state, and an amount of current 802 flowing to the readout circuitry 712 is below a predefined threshold, thereby producing a first logical value (e.g., a logical 0) output at the readout circuitry 712.

Figure 8C:
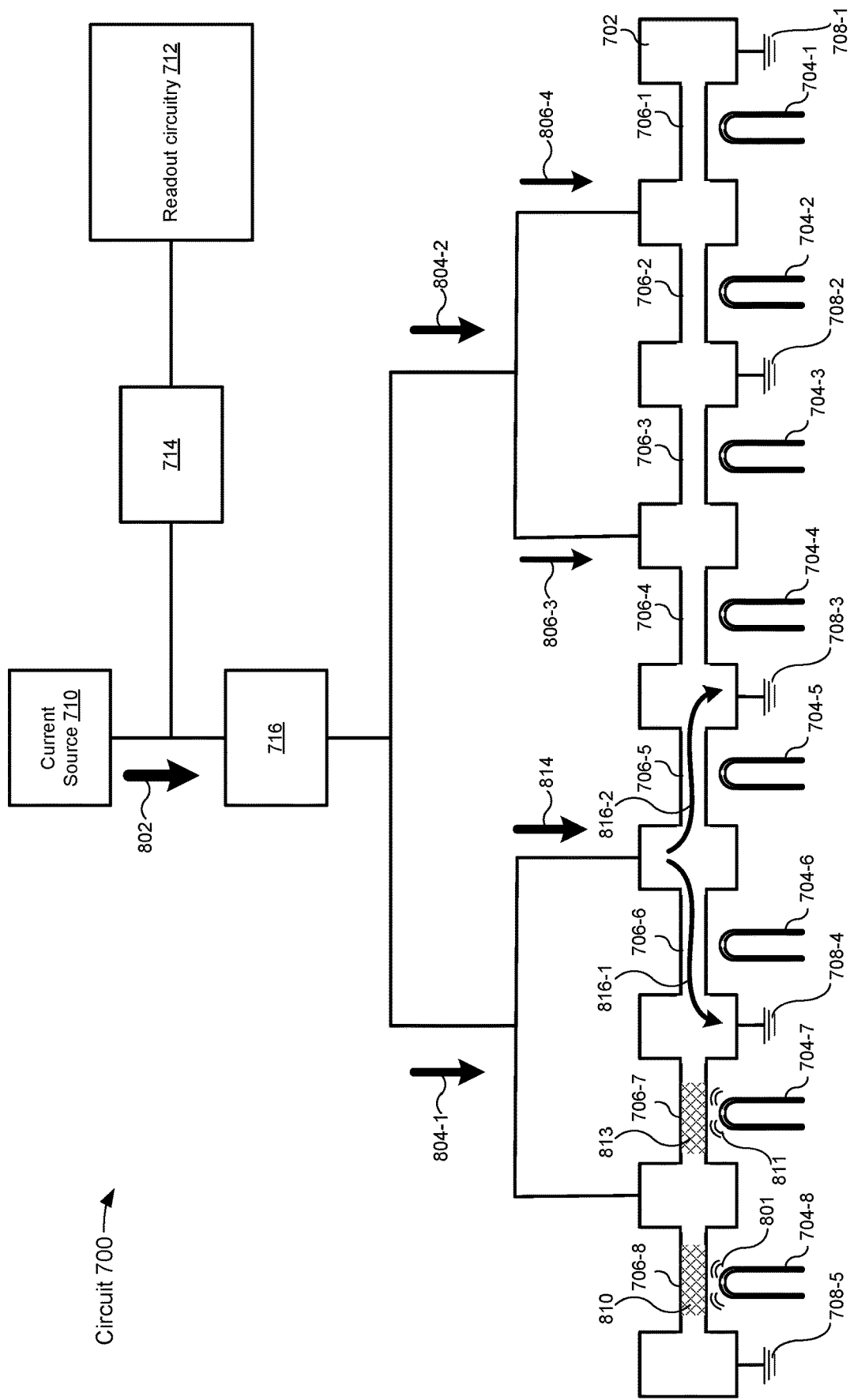

FIG. 8C shows the circuit 700 at a third time subsequent to the second time. At the third time, the heat source 704-7 is also active (e.g., the heat source 704-7, in addition to the heat source 704-8, is supplying heat to the narrow portion 706-7). In accordance with some embodiments, heat 811 transferring from the heat source 704-7 lowers a superconducting current threshold of the narrow portion 706-7 such that at least a portion 813 of the narrow portion 706-7 transitions to a non-superconducting state. The transition of the portion 813 of the narrow portion 706-7 to the non-superconducting state results in the current 812 (in FIG. 8B) redirecting to other portions of the superconducting component 702, as shown by increased currents 814, 816-1, and 816-2. In FIG. 8C, the narrow portion 706-6 (along with certain other narrow portions 706, such as 706-1 and 706-2) remains in a superconducting state, and an amount of current 802 flowing to the readout circuitry 712 is below a predefined threshold, thereby producing first logical value (e.g., a logical 0) output at the readout circuitry 712.

Figure 8D:
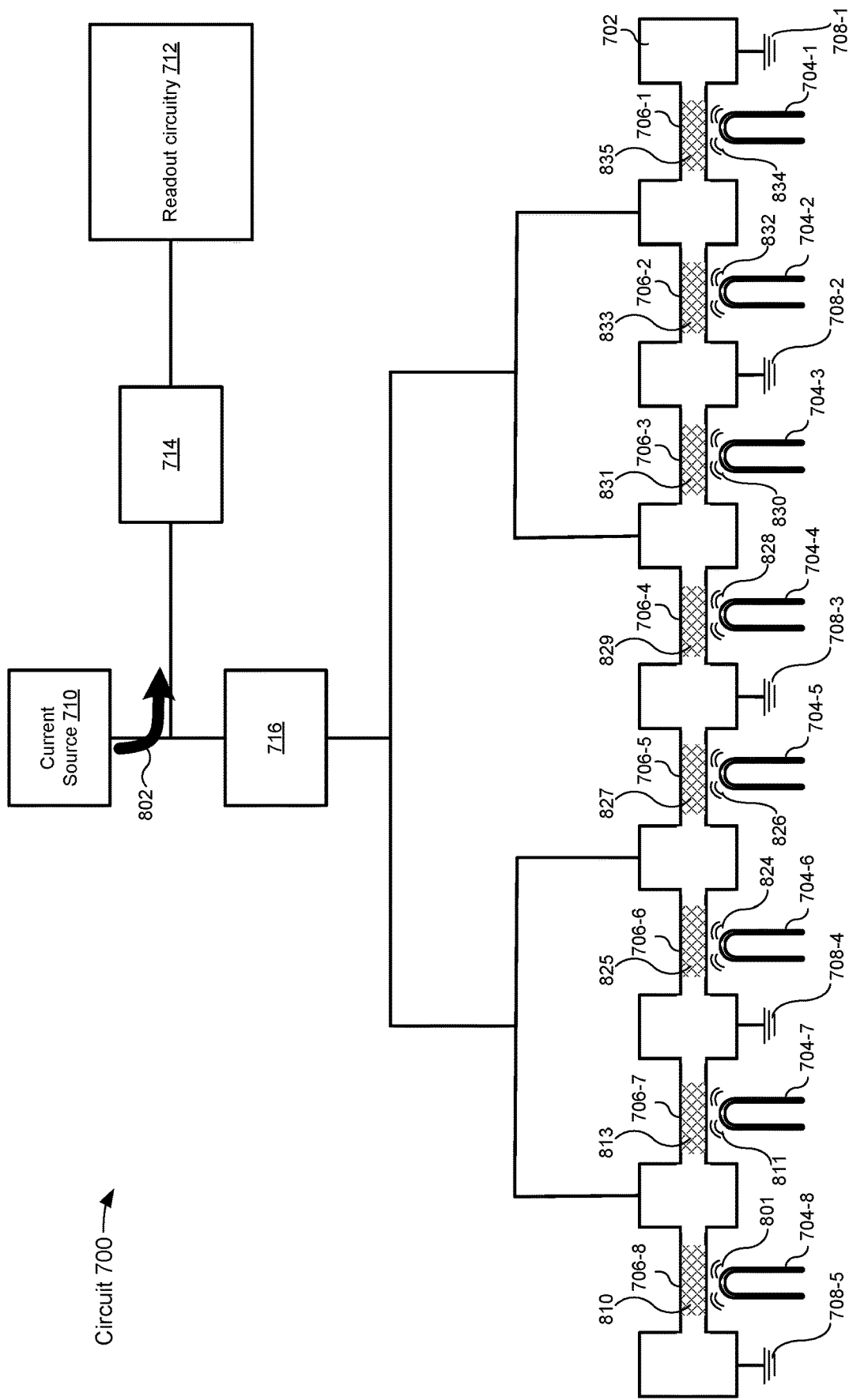

FIG. 8D shows the circuit 700 at a fourth time subsequent to the third time. At the fourth time, all of the heat sources 704 are active (e.g., all of the heat sources 704 are supplying heat to the corresponding narrow portions 706). In accordance with some embodiments, the heat (e.g., heat 801, 811, 824, 826, 828, 830, 832, and 834) transferring from each heat source 704 lowers a superconducting current threshold of the corresponding narrow portion 706 such that at least a portion of each narrow portion 706 (e.g., portions 810, 813, 825, 827, 829, 831, 833, and 835) transitions to the non-superconducting state. The transition of each narrow portion 706 to the non-superconducting state results in the current 802 being redirected to the readout circuitry 712 in accordance with some embodiments. In some embodiments, the circuit 700 is configured such that when the superconducting component 702 is in a non-superconducting state it has a significantly higher resistance than the resistance of the coupling component 714 and the readout circuitry 712, such that a majority of the current 802 flows through the readout circuitry 712. In this example, while all of the narrow portions of the superconducting component 702 are in the non-superconducting state, an amount of current 802 flowing to the readout circuitry 712 is above a predefined threshold, thereby producing a second logical value (e.g., a logical 1) output at the readout circuitry 712.

Thus, in the first mode of operation illustrated by FIGS. 8A-8D, the circuit 700 operates as a logical AND gate (e.g., each input 704 must be active to produce a logical 1 output at the readout circuitry 712). In some embodiments, the current 802 is configured such that the circuit 700 operates as a logical AND gate. For example, the current 802 is selected such that current redirected from one or more narrow portions 706 is insufficient to cause other narrow portions 706 to transition to the non-superconducting state.

FIGS. 9A-9D are prophetic diagrams illustrating a representative operating sequence of the superconducting circuit 700 of FIG. 7A in a second mode of operation (e.g., a logical OR mode of operation) in accordance with some embodiments.

Figure 9A:
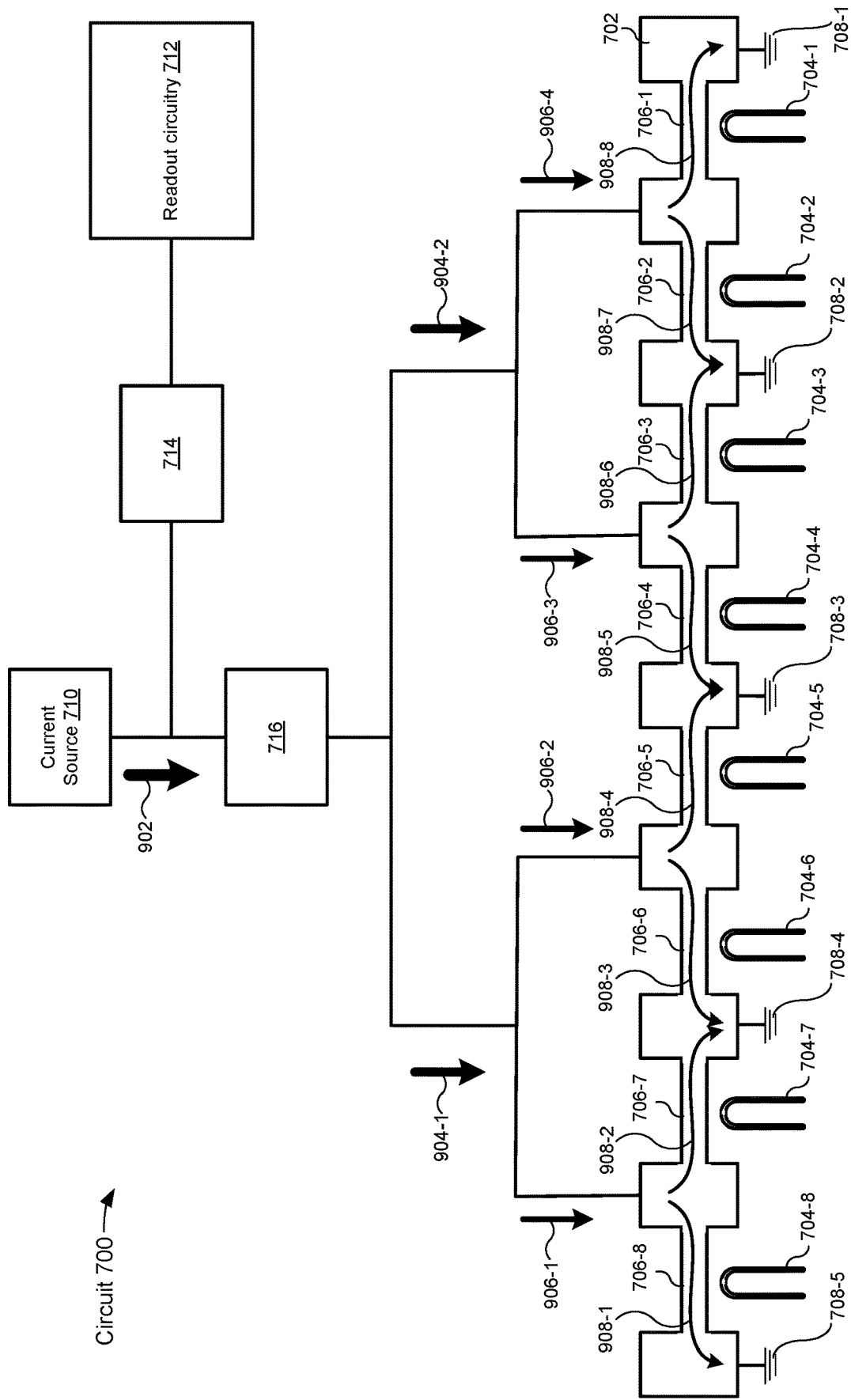
FIGS. 9A-9D are prophetic diagrams illustrating a representative operating sequence of the superconducting circuit of FIG. 7A in a second mode of operation in accordance with some embodiments.

FIG. 9A shows the circuit 700 at a first time. At the first time, the current source 710 supplies a current 902 to the superconducting component 702 via the component 716. In accordance with some embodiments, the current 902 is configured such that the superconducting component 702 is operating in a superconducting state. The current 902 splits (e.g., 50-50) to currents 904; the currents 904 split (e.g., 50-50) to corresponding currents 906; and the currents 906 split (e.g., 50-50) to currents 908. Thus, in accordance with some embodiments, each current 908 is approximately ⅛th of the current 902. In some embodiments, a resistance of the readout circuitry 712 and/or the coupling component 714 is significantly larger than a resistance through the component 716 and superconducting component 702 (when the superconducting component is in a superconducting state) and thus a large majority of the current 902 (e.g., 80%, 90%, or 99%) flows through the superconducting component 702. In this example, while any of the narrow portions of the superconducting component 702 is in the superconducting state, an amount of current 902 that flows to the readout circuitry 712 is below a predefined threshold, thereby producing a first logical value (e.g., a logical 0) output at the readout circuitry 712.

Figure 9B:
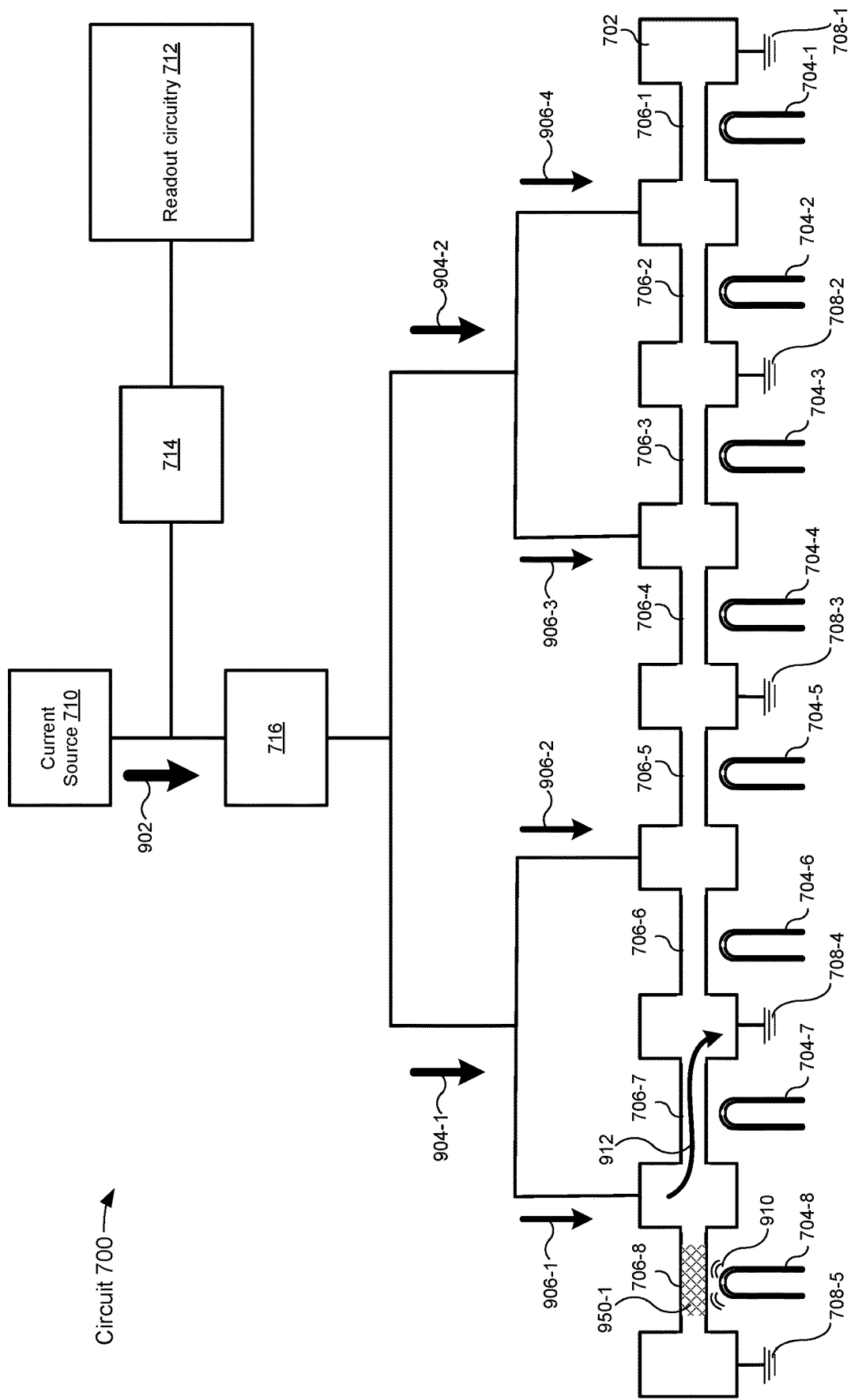

FIG. 9B shows the circuit 700 at a second time subsequent to the first time of FIG. 9A. At the second time, the heat source 704-8 is active (e.g., only the heat source 704-8 is supplying heat to the narrow portion 706-8). In accordance with some embodiments, heat 910 transferring from the heat source 704-8 lowers a superconducting current threshold of the narrow portion 706-8 such that at least a portion 950-1 of the narrow portion 706-8 transitions to a non-superconducting state. In some embodiments, the heat source 704-8 is a superconductor that has transitioned to the non-superconducting state and thus is generating resistive heat. The transition of the portion 950-1 of the narrow portion 706-8 to the non-superconducting state results in the current 908-1 (in FIG. 9A) being redirected to other portions of the superconducting component 702, as shown by increased current 912 through the narrow portion 706-7.

Figure 9C:
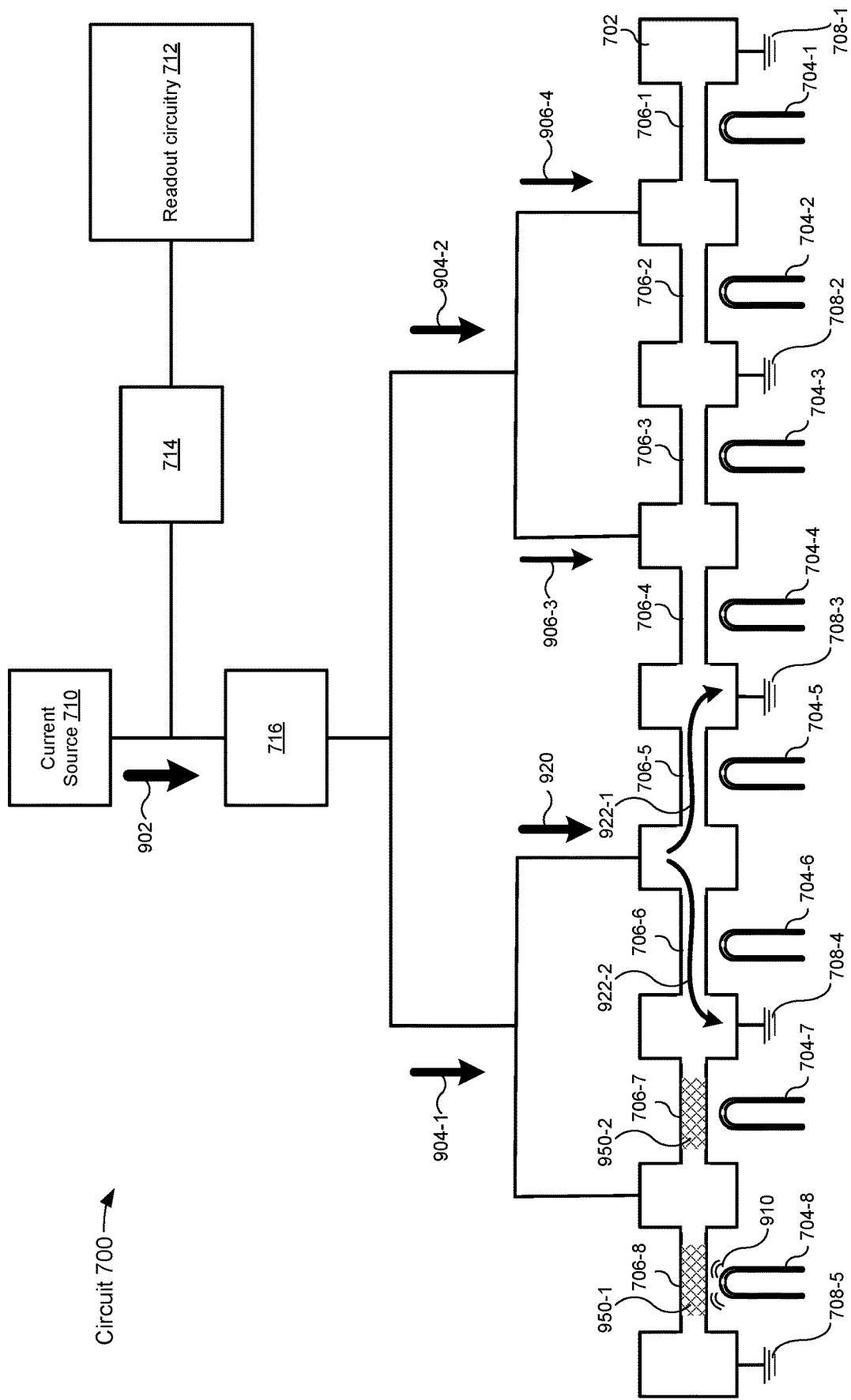

FIG. 9C shows the circuit 700 at a third time subsequent to the second time. At the third time, the narrow portion 706-7 has transitioned to the non-superconducting state due to the increased current 912 exceeding a superconducting current threshold of the narrow portion 706-7. Thus, at least a portion 950-2 of the narrow portion 706-7 transitions to a non-superconducting state. The transition of the portion 950-2 of the narrow portion 706-7 to the non-superconducting state results in the current 906-1 (in FIG. 9B) being redirected to other portions of the superconducting component 702, as shown by increased currents 920, 922-1, and 922-2. It is noted that while FIG. 9C shows currents 920, 922-1 and 922-2 as being increased, in some embodiments current 902 may be redistributed evenly or approximately evenly (e.g., with variations of no more than 25% from highest to lowest) over the remaining zero-resistance current paths to reference nodes 708, and thus currents 906-3 and 906-4 will also be increased, and currents 908-5 through 908-8 will also be increased. In some embodiments, the heat source 704-8 remains active at the third time.

Figure 9D:
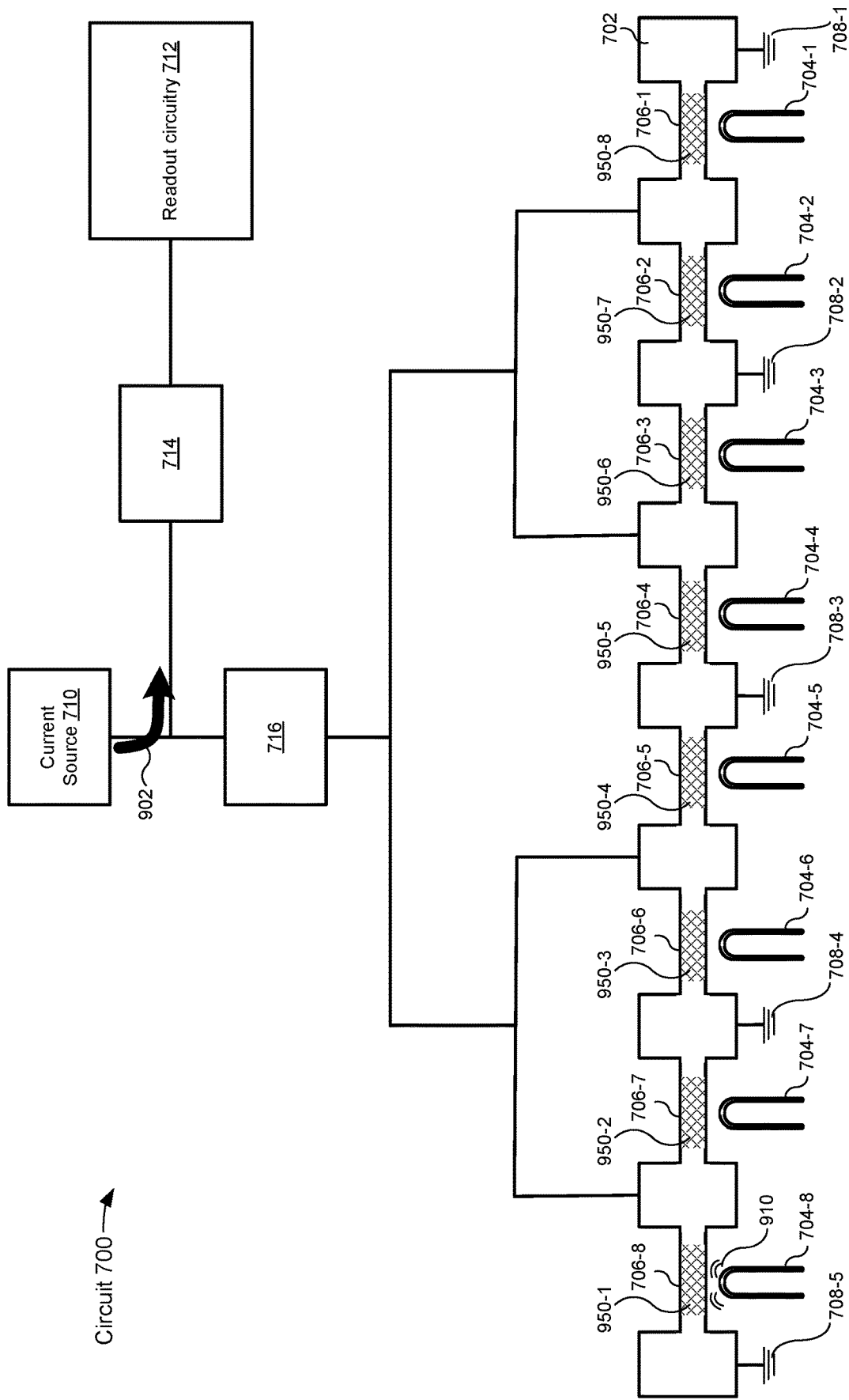

FIG. 9D shows the circuit 700 at a fourth time subsequent to the third time in FIG. 9C. At the fourth time, a respective portion 950 of each narrow portion 706 has transitioned to the non-superconducting state in response to the current through that portion exceeding a respective superconducting current threshold. In accordance with some embodiments, as each narrow portion 706 transitions to the non-superconducting state the current from current source 710 is redistributed, and the redistributed current in each narrow portion 706 exceeds a respective superconducting current threshold of those narrow portions, thus creating a cascade of all of the narrow portions 706 transitioning from a superconducting state to a non-superconducting state. In some embodiments, the heat source 704-8 remains active at the fourth time.

The transition of each narrow portion 706 to the non-superconducting state results in the current 902, or a substantial portion of the current 902, being redirected to the readout circuitry 712 in accordance with some embodiments. In some embodiments, the circuit 700 is configured such that when the superconducting component 702 is in a non-superconducting state, it has a significantly higher resistance than the resistance of the coupling component 714 and the readout circuitry 712, such that a majority of the current 902 flows through the readout circuitry 712. In this example, while all of the narrow portions of the superconducting component 702 are in the superconducting state, an amount of current 902 flowing to the readout circuitry 712 is above a predefined threshold, thereby producing a second logical value (e.g., a logical 1) output at the readout circuitry 712.

Thus, in the second mode of operation illustrated by FIGS. 9A-9D, the circuit 700 operates as a logical OR gate (e.g., one or more active inputs 704 will produce a logical 1 output at the readout circuitry 712). In some embodiments, the current 902 is configured such that the circuit 700 operates as a logical OR gate (e.g., the current 902 is greater than the current 802). For example, the current 902 is selected such that current redirected from one or more narrow portions 706 (e.g., from any one of the narrow portions 706) is sufficient to cause other narrow portions 706 to transition to the non-superconducting state.

In some embodiments, the circuit 700 is configured to operate in a third mode of operation (e.g., a logical majority-gate configuration). In the logical majority-gate configuration, the current needs to be redirected from a subset of the narrow portions (e.g., greater than 1 but less than all of the narrow portions) to cause the cascade effect, and thus heat must be supplied by a subset (e.g., at least a predefined number, where the predefined number is greater than 1 and less than the total number of narrow portions 706 in superconducting component 702) of the superconducting components 706 to transition all of the narrow portions to the non-superconducting state. While each of the narrow portions of the superconducting component 702 is in the non-superconducting state, the current from the current source 710, or a substantial portion of that current, is redirected to the readout component 712 (e.g., producing a logical 1 output at the readout component). In some embodiments, the circuit 700 is set in the logical AND configuration, the logical OR configuration, or the one or more Majority-Gate configurations by adjusting an amount of current supplied to the superconducting component 702 by the current source 710.

Figure 10:
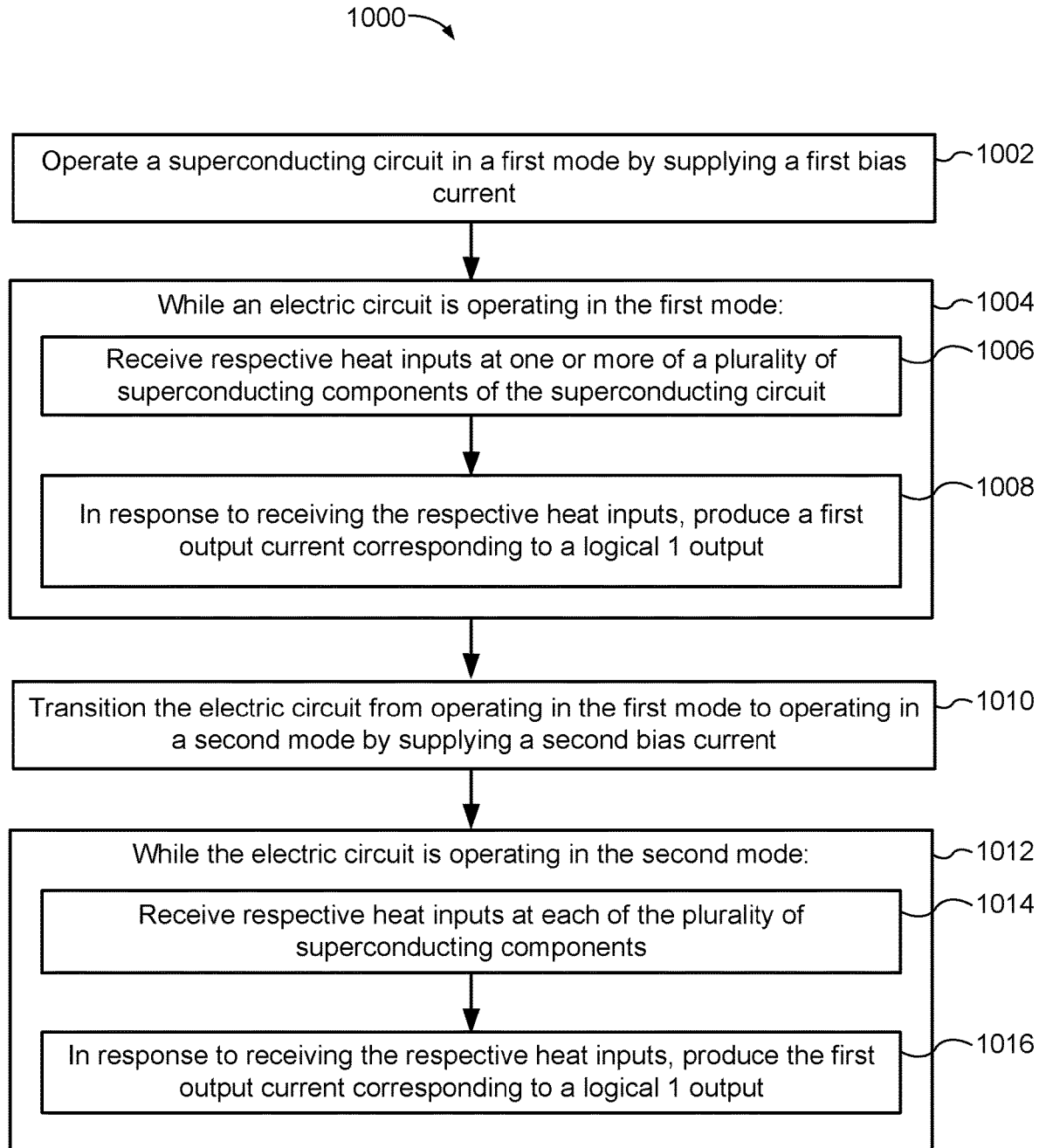
FIG. 10 is a flow diagram illustrating another representative method of operating a superconducting circuit in accordance with some embodiments.

FIG. 10 is a flow diagram illustrating a method 1000 of operating a superconducting circuit in accordance with some embodiments. In some embodiments, the method 1000 is performed at (e.g., using) a superconducting circuit (e.g., the circuit 700) having a plurality of superconducting components coupled in parallel with one another (e.g., the narrow portions 706). From another viewpoint, method 1000 is performed by a system that includes a superconducting circuit (e.g., circuit 700).

The superconducting circuit is operated (1002) in a first mode by supplying a first bias current (e.g., the current 902, FIG. 9A). While the superconducting circuit is in the first mode (1004): (a) respective heat inputs (e.g., the heat 910, FIG. 9B) are received (1006) at one or more of a plurality of superconducting components of the superconducting circuit; and (b) in response to receiving the respective heat inputs, the superconducting circuit produces (1008) a first output current corresponding to a second logical (e.g., a logical 1) output (e.g., the current 902, FIG. 9D).

The superconducting circuit is transitioned (1010) from operating in the first mode to operating in the second mode by supplying a second bias current (e.g., the current 802, FIG. 8A). While the superconducting circuit is in the second mode (1012): (a) respective heat inputs (e.g., the heat 801, 811, 824, 826, 828, 830, 832, and 834, FIG. 8D) are received (1014) at each of the plurality of superconducting components of the superconducting circuit; and (b) in response to receiving the respective heat inputs, the superconducting circuit produces (1016) a first output current corresponding to a first logical output (e.g., the current 802, FIG. 8D).

In some embodiments, while in the first mode, in response to the heat input(s), the plurality of superconducting components transitions from the superconducting state to the non-superconducting state (e.g., the non-superconducting portions 950 in FIGS. 9B-9D).

In some embodiments, while in the second mode, in response to providing the heat inputs to less than all of the superconducting components, the remaining superconducting components of the plurality of superconducting components continue to operate in the superconducting state (e.g., as illustrated in FIGS. 8B and 8C). In some embodiments, while in the second mode, in response to providing the heat inputs to all of the superconducting components, the plurality of superconducting components transitions from the superconducting state to the non-superconducting state (e.g., as illustrated in FIG. 8D).

In some embodiments, the superconducting circuit functions as a logical OR gate while operating in the first mode and functions as a logical AND gate while operating in the second mode.

In accordance with some embodiments, an electric circuit includes: (1) a plurality of superconducting components (e.g., narrow portions 706 of superconducting component 702, FIG. 7A); (2) a plurality of heat sources (e.g., superconducting components 704, FIG. 7A), each heat source of the plurality of heat sources coupled to a corresponding superconducting component of the plurality of superconducting components (e.g., heat source 704-1 is thermally-coupled to narrow portion 706-1 in FIG. 7A) and configured to selectively provide heat to the corresponding superconducting component (e.g., heat source 704-1 provides heat to narrow portion 706-1 while current is provided to heat source 704-1 and provides no heat to narrow portion 706-1 while no current is provided to heat source 704-1); (3) a first current source (e.g., current source 710, FIG. 7A) coupled to the plurality of superconducting components, the first current source configured to selectively provide: (a) a first current adapted to bias the plurality of superconducting components such that combination of the first current and heat from any heat source of the plurality of heat sources causes the plurality of superconducting components to transition from a superconducting state to a non-superconducting state; and (b) a second current adapted to bias the plurality of superconducting components such that (i) a combination of the second current and heat from each heat source of the plurality of heat sources causes the plurality of superconducting components to transition from the superconducting state to the non-superconducting state, and (ii) a combination of the second current and heat from each heat source of only a subset of the plurality of heat sources does not cause the plurality of superconducting components to transition to the non-superconducting state (e.g., the first current source provides the first current in accordance with a determination that a received electrical signal indicates that the electrical circuit should operate as an OR gate and the first current source provides the second current in accordance with a determination that the received electrical signal indicates that the electrical circuit should operate as an AND gate); and (4) an output node (e.g., coupled to readout component 712, FIG. 7A) adapted to output a respective current while the plurality of superconducting components is in the non-superconducting state. In some embodiments, the electric circuit is configured to perform any of the methods described herein.

In some embodiments, the electric circuit consists essentially of a single metal layer (e.g., the electric circuit includes no more than one layer of metal, and also includes one or more other layers of material other than metal, such as a thin film of superconducting material). In some embodiments, the plurality of superconducting components includes a plurality of narrow portions of a thin film of superconducting material. In some embodiments, the plurality of heat sources is electrically-isolated from the plurality of superconducting components. In some embodiments, the current source is configured to selectively operate the electrical circuit in any one of a logical OR configuration, a logical AND configuration, and a logical majority-gate configuration. In some embodiments, each heat source of the plurality of heat sources and the first current source are coupled to the thin film such that no metal layers overlap the thin film. In some embodiments, the plurality of superconducting components and the plurality of heat sources are patterned from a single thin film (e.g., a single contiguous layer of superconducting material is patterned to define the plurality of superconducting components and the plurality of heat sources).

In some embodiments, the plurality of superconducting components includes a plurality of narrow portions of a thin film of superconducting material. In some embodiments, the plurality of heat sources is electrically-insulated or isolated from the plurality of superconducting components.

In accordance with some embodiments, an electric circuit includes: (1) a thin film of superconducting material (e.g., superconducting component 702, FIG. 7A), the thin film having a plurality of alternating narrow and wide portions (e.g., including the narrow portions 706); (2) a plurality of current sources, each current source of the plurality of current sources coupled to a corresponding narrow portion of the plurality of alternating narrow and wide portions and configured to selectively provide a first current to the corresponding narrow portion; (3) a first current source coupled to each narrow portion of the plurality of alternating narrow and wide portions, the first current source configured to selectively provide: (a) a second current adapted to bias each narrow portion of the plurality of alternating narrow and wide portions such that a combination of the second current and the first current from any current source of the plurality of current sources causes each narrow portion of the plurality of alternating narrow and wide portions to transition from a superconducting state to a non-superconducting state; and (b) a third current adapted to bias each narrow portion of the plurality of alternating narrow and wide portions such that (i) a combination of the third current and the first current from each (i.e., every) current source of the plurality of current sources causes each narrow portion of the plurality of alternating narrow and wide portions to transition from the superconducting state to the non-superconducting state, and (ii) a combination of the third current and the first current from each current source of only a subset of the plurality of current sources does not cause each narrow portion of the plurality of alternating narrow and wide portions to transition to the non-superconducting state (i.e., one or more of the narrow portions remains in the superconducting state); and (4) an output node (e.g., coupled to readout component 712, FIG. 7A) adapted to output a respective current while each narrow portion of the plurality of alternating narrow and wide portions is in the non-superconducting state. In some embodiments, the electric circuit is configured to perform any of the methods described herein.

In some embodiments, the electric circuit consists of a single metal layer (e.g., the electric circuit includes no more than one layer of metal, and also includes one or more other layers of material other than metal, such as a thin film of superconducting material).

In some embodiments, each current source of the plurality of current sources and the first current source are coupled to the thin film via a single metal (semiconducting) layer. In some embodiments, each current source of the plurality of current sources and the first current source are coupled to the thin film such that no metal layers overlap the thin film.

Photonic Systems

Figure 11A:
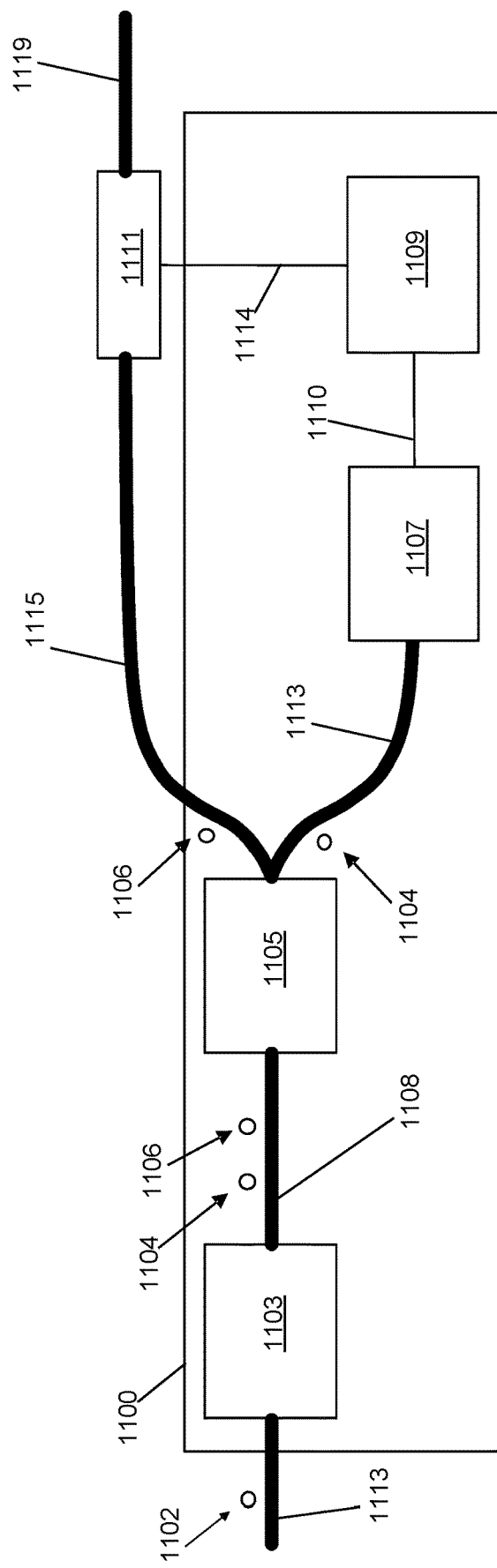
FIGS. 11A-11B illustrate a representative photonic circuit employing a superconducting photon detector in accordance with one or more embodiments.
Figure 11B:
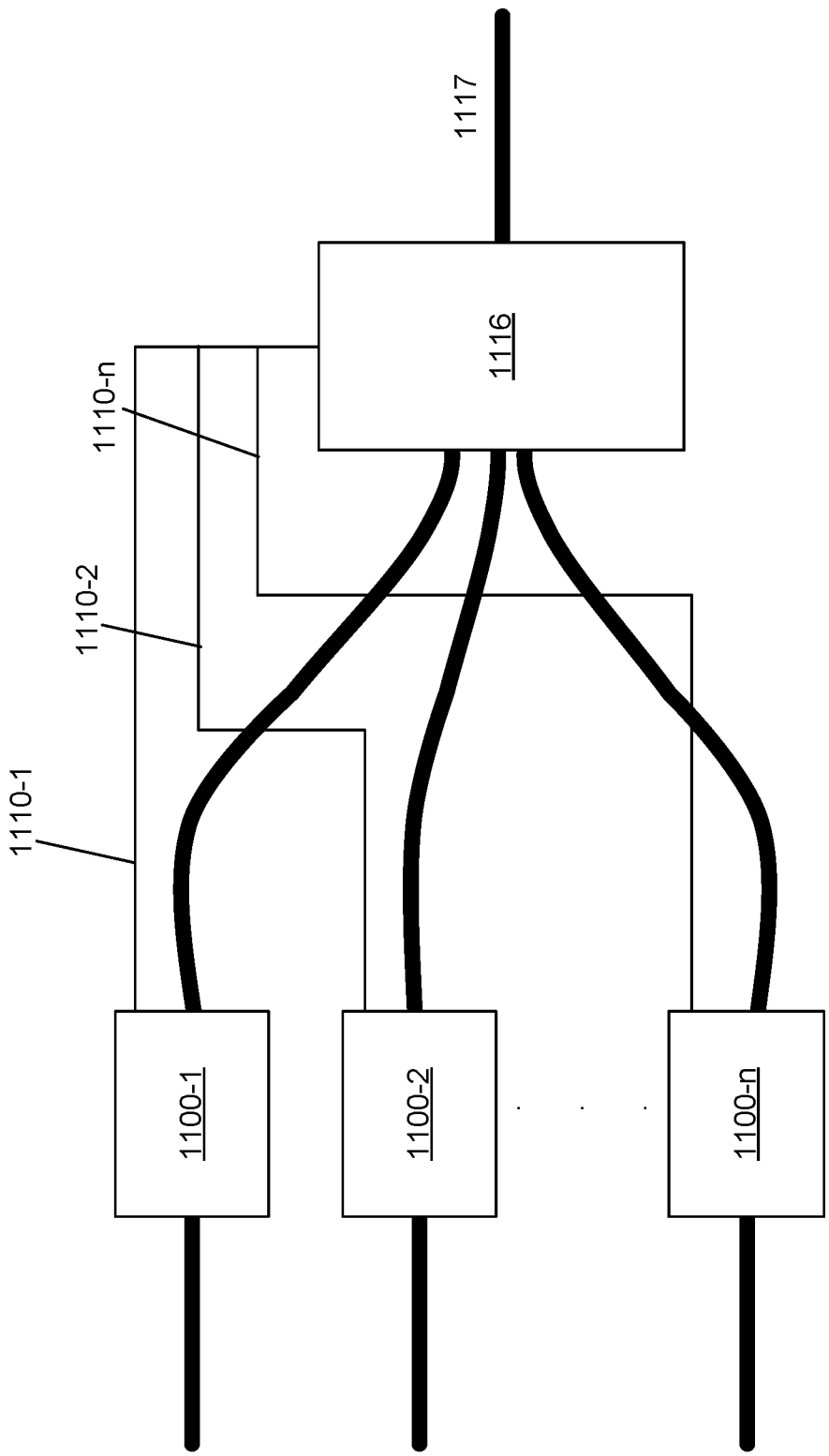

FIGS. 11A-11B show examples of a photonic system that can employ one or more superconducting circuits in accordance with one or more embodiments. In the embodiments shown in FIGS. 11A-11B, a superconducting circuit, e.g., any of the circuits 100, 130, and 700, and/or any of the arrangements shown in FIGS. 1-10 described above can be employed as one or more logic components, e.g., as readout circuits for photodetectors such as single-photon detectors. More specifically, the FIGS. 11A-11B illustrate a heralded single photon source in accordance with one or more embodiments. Such a source can be used within any system for which a source of single photons is useful, e.g., within a quantum communications system and/or a quantum computer that employs entangled photons as the physical qubits.

Turning to FIG. 11A, a heralded single photon source 1100 is illustrated in accordance with one or more embodiments. Thick black lines in the figure represent optical waveguides and thin black lines represent electrical interconnects (e.g. wires that may be formed from superconducting or non-superconducting materials). The system is a hybrid photonic/electrical circuit that includes a pumped photon pair generator 1103, a wavelength division multiplexer (WDM) 1105 (which is a 1×2 WDM in this example), a superconducting photon detector 1107, a superconducting amplifier circuit 1109, and an optical switch 1111. One or more components of the system can be housed in a cryogenic environment, such as a cryostat, held at a temperature that is lower than the threshold temperature for superconductivity, as described above.

An input optical waveguide 1113 optically couples a pump photon source (not shown) to photon pair generator 1103. A pump photon 1102 enters the pumped photon pair generator 1103 via input optical waveguide 1113. For the sake of illustration, any photons illustrated here are depicted outside of the waveguides, but one of ordinary skill will appreciate that in a physical device, these photons will propagate within one or more guided modes of the waveguide. In some embodiments, the pumped photon pair generator 1103 can include a nonlinear optical material that generates two output photons, referred to as signal photon 1104 and idler photon 1106 from one or more input pump photons 1102. For example, the pumped photon pair generator 1103 can generate a pair of output photons using a process known as spontaneous four wave mixing. The pair of output photons, signal photon 1104 and idler photon 1106, are typically generated having different wavelengths/frequencies, e.g., with the sum of the energies of the signal and idler equal to the energy of the pump photon. After generation, signal photon 1104 and idler photon 1106 are optically coupled to the input of WDM 1105 via waveguide 1108. Because photons 1104 and 1106 have different wavelengths/frequencies, WDM 1105 redirects each photon along a different output waveguide, e.g., signal photon 1104 is directed along the heralding waveguide path 1113 and idler photon 1106 is redirected along the switched output waveguide path 1115. Which photon is directed to which path is not critical and the path of the idler photon and signal photon can be exchanged without departing from the scope of the present disclosure.

In this example, a superconducting photon detector 1107, e.g., a superconducting nanowire single photon detector, is optically coupled to the heralding waveguide path 1113 and can produce an electrical signal (e.g. a current pulse, also referred to as a photon heralding signal) in response to the detection of the signal photon 1104. Because the signal photon 1104 and idler photon 1106 were generated nearly simultaneously as a pair, the electrical signal generated by the photon detector 1107 signals (i.e., "heralds") the presence of the idler photon 1106 in the switched output waveguide path 1115. The heralding signal is often a small amplitude current signal, e.g., microamps or less, and can be provided to the superconducting amplifier circuit 1109 where it is amplified to a larger output signal that can be used to more effectively drive any downstream electronic and/or photonic circuits. Referring momentarily to the FIGS. 3A-3E described above, the small heralding signal corresponds to the current 204 (e.g., current 204-1, FIG. 3B) that provides a small current to a superconducting circuit, e.g., superconductor 122-1 in FIG. 3B and/or any of the arrangements shown in FIGS. 1-10, to drive the superconducting wires of the circuit into the non-superconducting state. The amplified signal (e.g., a combination of currents 302 and 204-2, FIG. 3E) is then provided to the optical switch 1111 via output electrical signal line 1114. Accordingly, the use of the superconducting amplifier circuit 1109 provides for a system that can drive higher current loads than would be the case with photon detector 1107 operating on its own. After being switched, the idler photon 1106 is provided via output waveguide 1119, e.g., for use in constructing a highly entangled resource state for use in a downstream optical quantum computing system (not shown).

FIG. 11B illustrates how several single photon sources similar to photon source 1100 can be multiplexed to increase the reliability of the photon generation process. Such a system is beneficial because of the non-deterministic nature of the conversion between the pump photon and the photon pair in the photon pair generator 1103. More specifically, because the photon pair generation process is a quantum mechanical process, it is inherently probabilistic, and thus it is not guaranteed that every pump photon that enters a photon pair generator 1103 will result in the generation of a photon pair at the output. In fact, in some instances, the photon pair creation can fail entirely. Thus, to improve the reliability of the photon generation process, several single photon generators 1100-1, 1100-2, . . . , 1100-n, each receiving its own pump photon per generation cycle, can be arranged in parallel and optically (and electrically) coupled to a N×1 switch 1116, as shown. As with the heralded single photon source 1100, each single photon generator 1100-1, 1100-2, . . . , 1100-n possesses, or has an output coupled to, a corresponding dedicated heralding electrical signal line 1110-1, 1110-2, . . . , 1110-n, which can provide a heralding signal that informs a downstream circuit element of the successful generation of a photon by that particular photon source. In some embodiments, the heralding electrical signal lines 1110-1, 1110-2, . . . , 1110-n are electrically coupled to the N×1 switch 1116. N×1 switch 1116 includes digital logic that interprets the heralding electrical signals and switches the input port of the N×1 switch 1116 accordingly so as to provide the generated idler photon to the output port 1117. Thus, in this case, each photon source 1100 includes a superconducting amplifier circuit whose internal arrangement of current sources and parallel superconducting wires provides for enough amplification to drive the logic stage of the N×1 switch. In other examples, a small signal logic circuit can be employed before the amplifier and N×1 switch. One of ordinary skill will appreciate that other arrangements are possible without departing from the scope of the present disclosure.

As used herein, the phrase "does not cause the plurality of superconducting components to transition to the non-superconducting state" is equivalent to the phrase "causes less than all of the plurality of superconducting components to transition to the non-superconducting state." As used herein a "subset of the plurality of heat sources" includes at least one, but less than all, of the plurality of heat sources.

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An electric circuit, comprising:
   one or more photon detector components;
   a superconducting logic gate component coupled to respective outputs of the one or more photon detector components;
   a bias source electrically coupled to the superconducting logic gate component, the bias source configured to provide a bias current adapted to cause the superconducting logic gate component to function as a logical gate; and
   an optical switch component electrically coupled to an output of the superconducting logic gate component.

2. The electric circuit of claim 1, wherein the bias source is configurable to provide the bias current at a first current level, wherein the bias current at the first current level is adapted to bias the superconducting logic gate component to function as a logical AND gate.

3. The electric circuit of claim 2, wherein the bias source is further configurable to provide the bias current at an additional current level that is higher than the first current level, wherein the bias current at the additional current level is adapted to cause the superconducting logic gate component to function as a logical OR gate.

4. The electric circuit of claim 1, wherein the bias current is adapted to cause the superconducting logic gate component to function as a logical majority gate.

5. The electric circuit of claim 1, wherein the bias current is configured to selectively cause the superconducting logic gate component to function as a logical OR gate or a logical AND gate.

6. The electric circuit of claim 1, wherein the superconducting logic gate component is thermally coupled to the one or more photon detector components.

7. The electric circuit of claim 6, wherein the superconducting logic gate component is electrically insulated from the one or more photon detector components.

8. The electric circuit of claim 1, wherein the one or more photon detector components are coupled to one or more heralding waveguide paths and the optical switch is coupled to an output waveguide path.

9. The electric circuit of claim 1, wherein the one or more photon detector components are coupled to one or more probabilistic photon sources.

10. The electric circuit of claim 1, wherein the photon detector component comprises a superconducting component.

11. The electric circuit of claim 1, wherein the optical switch component comprises a N×1 optical switch.

12. The electric circuit of claim 1, wherein the superconducting logic gate component comprises a plurality of superconducting wires coupled in parallel with one another.

13. The electric circuit of claim 1, wherein the superconducting logic gate component comprises a superconducting material having alternating narrow and wide sections.

14. The electric circuit of claim 1, wherein the superconducting logic gate component comprises one or more inductors.

15. The electric circuit of claim 1, wherein the superconducting logic gate component and the photon detector component are disposed on a same layer of material.

16. The electric circuit of claim 15, wherein the layer of material is a layer of superconducting material.

* * * * *